United States Patent
Tang et al.

(10) Patent No.: US 10,941,243 B2
(45) Date of Patent: Mar. 9, 2021

(54) POLYMER POLY (TRIPHENYLACRYLONITRITE) AND SYNTHESIS THEREOF

(71) Applicant: THE HONG KONG UNIVERSITY OF SCIENCE AND TECHNOLOGY, Hong Kong (CN)

(72) Inventors: Benzhong Tang, Hong Kong (CN); Zijie Qiu, Hong Kong (CN)

(73) Assignee: THE HONG KONG UNIVERSITY OF SCIENCE AND TECHNOLOGY, Hong Kong (CN)

( * ) Notice: Subject to any disclaimer, the term of this patent is extended or adjusted under 35 U.S.C. 154(b) by 77 days.

(21) Appl. No.: 16/341,260

(22) PCT Filed: Oct. 9, 2017

(86) PCT No.: PCT/CN2017/105349
§ 371 (c)(1),
(2) Date: Apr. 11, 2019

(87) PCT Pub. No.: WO2018/068688
PCT Pub. Date: Apr. 19, 2018

(65) Prior Publication Data
US 2019/0233575 A1    Aug. 1, 2019

Related U.S. Application Data

(60) Provisional application No. 62/496,291, filed on Oct. 13, 2016.

(51) Int. Cl.
*C08G 61/12*    (2006.01)
*C09K 11/06*    (2006.01)
(Continued)

(52) U.S. Cl.
CPC ............ *C08G 61/12* (2013.01); *C08G 61/02* (2013.01); *C09K 11/06* (2013.01); *G03F 7/038* (2013.01);
(Continued)

(58) Field of Classification Search
CPC ............. C08G 61/12; C08G 2261/143; C08G 2261/148; C08G 2261/312;
(Continued)

(56) References Cited

U.S. PATENT DOCUMENTS

2004/0002578 A1    1/2004    Yamamoto et al.

FOREIGN PATENT DOCUMENTS

| CN | 104829848 A | 8/2015 |
| CN | 104877665 A | 9/2015 |
| CN | 104974745 A | 10/2015 |

OTHER PUBLICATIONS

Qiu, Zijie et al., "Polyarylcyanation of Diyne: A One-Pot Three-Component Convenient Route for In Situ Generation of Polymers with AIE Characterisitcs", Macromolecules, vol. 49, No. 23, pp. 8888-8898, Nov. 29, 2016.

(Continued)

*Primary Examiner* — Shane Fang
(74) *Attorney, Agent, or Firm* — Nath, Goldberg & Meyer; Joshua B. Goldberg

(57) ABSTRACT

A method is directed to synthesis of poly(triphenylacrylonitrite)s (PTPANs) comprising polycoupling dibromoarenes, internal diynes, and potassium ferrocyanide, resulting in polycoupled dibromoarenes, internal diynes, and potassium ferrocyanide; and producing poly(triphenylacrylonitrite)s (PTPANs) by catalysis of the polycoupled dibromoarenes, internal diynes, and potassium ferrocyanide with palladium acetate and sodium bicarbonate, wherein the catalysis is (Continued)

allowed to proceed in dimethylacetamide under nitrogen at a prescribed temperature for a prescribed time. Further, poly(triphenylacrylonitrite)s (PTPANs) is a polymer and comprises a backbone structure of

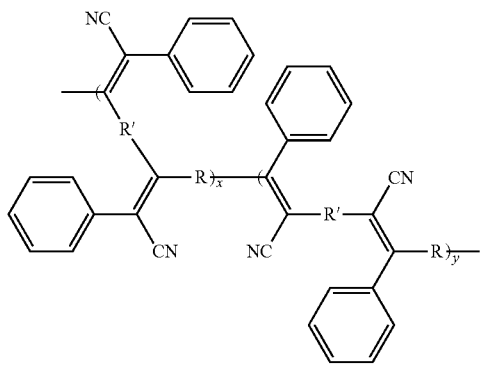

P1a-d/2a-b/3 wherein x and y are integers;
wherein each R is independently selected from the group consisting of

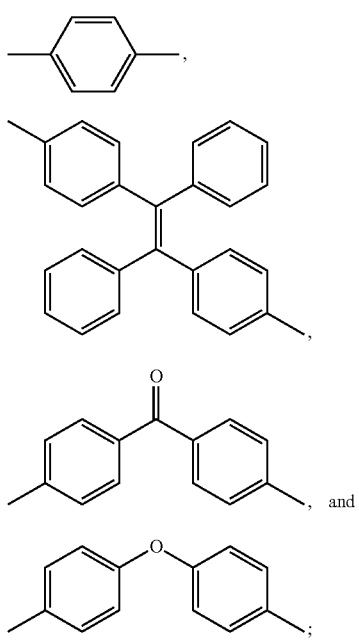

1a 1b 1c , and 1d

;

and
wherein each R' is independently selected from the group consisting of

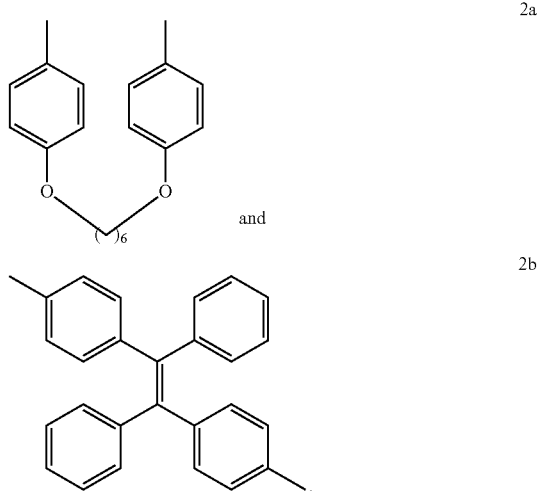

2a and

2b

20 Claims, 26 Drawing Sheets

(51) Int. Cl.
    *C08G 61/02*     (2006.01)
    *G03F 7/038*     (2006.01)
    *G03F 7/039*     (2006.01)

(52) U.S. Cl.
    CPC ....... *G03F 7/039* (2013.01); *C08G 2261/143* (2013.01); *C08G 2261/148* (2013.01); *C08G 2261/312* (2013.01); *C08G 2261/316* (2013.01); *C08G 2261/344* (2013.01); *C08G 2261/3422* (2013.01); *C08G 2261/3424* (2013.01); *C09K 2211/1425* (2013.01); *C09K 2211/1433* (2013.01)

(58) Field of Classification Search
    CPC ...... C08G 2261/316; C08G 2261/3422; C08G 2261/3424; C08G 2261/344; C09K 11/06; C09K 2211/1425; C09K 2211/1433; G03F 7/038; G03F 7/039
    USPC ........................................................ 528/392
    See application file for complete search history.

(56) References Cited

OTHER PUBLICATIONS

Liu, Yajing et al., "Multicomponent Polycoupling of Internal Diynes, Aryl Diiodides, and Boronic Acids to Functional Poly(tetraarylethene)s", Macromolecules, vol. 48, No. 22, pp. 8098-8107, Nov. 9, 2015.

POLYMER POLY (TRIPHENYLACRYLONITRITE) AND SYNTHESIS THEREOF

CROSS REFERENCE

The present application claims priority to provisional U.S. Patent Application No. 62/496,291 filed Oct. 13, 2016, which was filed by the inventors hereof and is incorporated by reference herein in its entirety.

TECHNICAL FIELD

The present subject matter relates generally to synthesis of a polymer, and more specifically synthesis of poly(triphenylacrylonitrite) polymers by one-pot three component polyarylcyanation of diyne, as well as the corresponding features thereof.

BACKGROUND

The development of efficient luminescent materials in the solid state has attracted much attention for their fundamental importance and practical implication. However, one problem which hinders such development is that the light emissions of conventional luminescent materials are often partially or even completely quenched when they form aggregates. This aggregation-caused quenching (ACQ) must be solved as luminescent materials are widely used as solid thin films for their real-world applications. Recently, a new class of luminogens is found to be weakly or non-emissive in solution but display enhanced emission upon aggregation. This unusual phenomenon is known as aggregation-induced emission (AIE) and is the exact opposite of the ACQ effect. Until now, a variety of AIE molecules with diverse structures and functionalities have been developed. Typical AIE luminogens (AIEgens), such as tetraphenylethene (TPE), triphenylethene (TriPE) and hexaphenylsilole (HPS), possess a common feature of a propeller-shaped structure with freely rotatable peripheral aromatic rings. Generally, when AIEgens are incorporated into the polymer structure, macromolecules with AIE properties are obtained.

Compared to their small molecular weight counter parts, AIE polymers show many unique advantages, such as tunable structure and topology, and easy modification for multiple functionalities. Besides, AIE polymers usually possess good processability and thus can be fabricated into large-area thin solid films and devices by simple and energy-saving techniques. These unique properties enable AIE polymers to find a variety of high-tech applications in the aggregated or solid state, such as sensitive and selective fluorescent chemosensors, efficient emitters in organic light-emitting diodes with high quantum efficiency, multi-responsive materials, photopatterning, biological imaging, etc. Attracted by such prospective, various kinds of AIE polymers, such as polyacetylenes, polyphenylenes, polytriazoles and poly(phenyleneethylene)s have been reported, thanks to the elaborate efforts by various polymer scientists.

These macromolecules are generally obtained by (1) polymerizing the monomers with AIEgens; (2) attaching AIEgens to polymerizable monomers, whose homopolymerization or copolymerization affords polymers with AIEgens in the side chains; or (3) using AIEgens as polymerization initiators to produce polymers with AIEgens on the terminal. While AIE polymers with different architectures and properties can be readily obtained through these strategies, monomers carrying AIEgens need to be presynthesized by time-consuming synthetic routes. Another approach for generating AIE polymers is to generate the AIEgens in-situ by reaction of non-AIE reactants during the polymerization, instead of inherited from the monomers. Such a synthesis route can simplify the overall production process. Besides, it is even possible to utilize fluorescence to monitor the polymerization procedure. However, it is still challenging to develop such a system and only a few examples are available in the literature. Moreover, the molecular weight of those reported polymers are not very high ($M_w$ less than 20,000). This is presumably due to limited organic reactions with mild reaction condition, high efficiency, and broad reaction scope towards AIEgens.

SUMMARY

In an embodiment, the present subject matter is directed to a polymer, wherein the polymer is poly(triphenylacrylonitrite)s (PTPANs) and comprises a backbone structure of

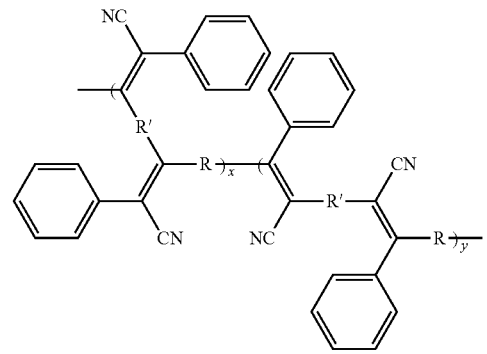

P1a-d/2a-b/3 wherein x and y are integers;

wherein each R is independently selected from the group consisting of

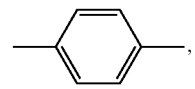

1a

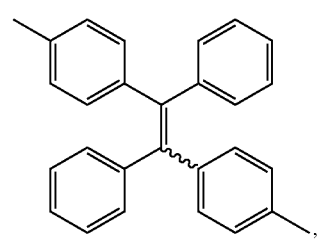

1b

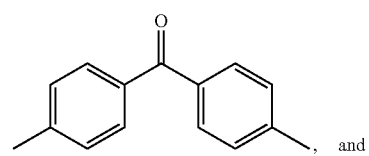

1c

, and

-continued

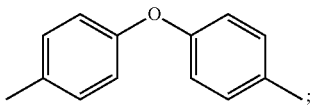
1d and
wherein each R' is independently selected from the group consisting of

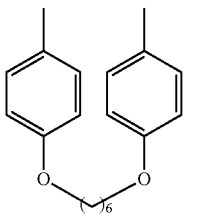
2a

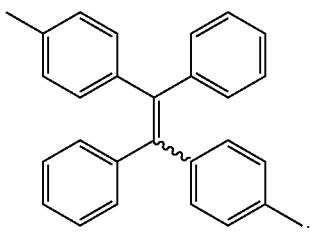
2b

An embodiment of the present subject matter is directed to a method of synthesis of poly(triphenylacrylonitrite)s (PTPANs) comprising:

polycoupling dibromoarenes, internal diynes, and potassium ferrocyanide, resulting in polycoupled dibromoarenes, internal diynes, and potassium ferrocyanide; and producing poly(triphenylacrylonitrite)s (PTPANs) by catalysis of the polycoupled dibromoarenes, internal diynes, and potassium ferrocyanide with palladium acetate and sodium bicarbonate, wherein the catalysis is allowed to proceed in dimethylacetamide under nitrogen at a prescribed temperature for a prescribed time.

BRIEF DESCRIPTION OF THE DRAWINGS

FIG. 30 shows the single-crystal structure of 6a.

DETAILED DESCRIPTION

Figure 1:
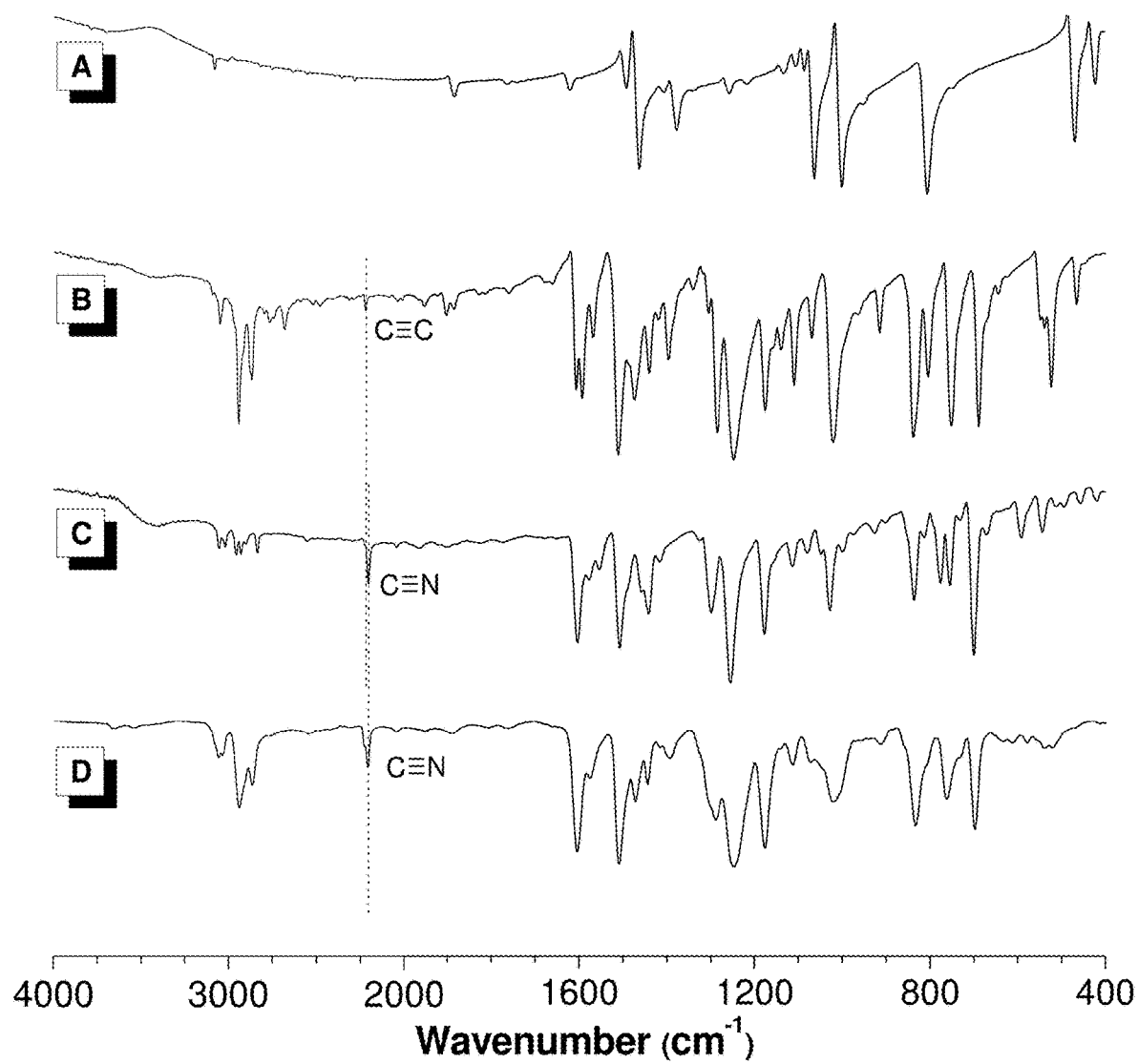
FIG. 1 shows IR spectra of (A) 1a, (B) 2a, (C) 6, and (D) P1a/2a/3.

The following detailed description of the present subject matter is provided to aid those skilled in the art in practicing the present subject matter. However, the following detailed description should not be constructed to unduly limit the present subject matter. Variations and modifications in the embodiments discussed may be made by these of ordinary skill in the art without departing from the scope of the present subject matter.

Where a range of values is provided, for example, concentration ranges, percentage ranges, or ratio ranges, it is understood that each intervening value, to the tenth of the unit of the lower limit, unless the context clearly dictates otherwise, between the upper and lower limit of that range and any other stated or intervening value in that stated range, is encompassed within the described subject matter. The upper and lower limits of these smaller ranges may independently be included in the smaller ranges, and such embodiments are also encompassed within the described subject matter, subject to any specifically excluded limit in the stated range. Where the stated range includes one or both of the limits, ranges excluding either or both of those included limits are also included in the described subject matter.

For purposes of better understanding the present teachings and in no way limiting the scope of the teachings, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that may vary depending upon the desired properties sought to be obtained. At the very least, each numerical parameter should at least be construed in light of the number of reported significant digits and by applying ordinary rounding techniques.

It is noted that, as used in this specification and the appended claims, the singular forms "a," "an" and "the" include plural references unless the context clearly dictates otherwise. As such, the use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

Throughout the application, descriptions of various embodiments use "comprising" language; however, it will be understood by one of skill in the art, that in some specific instances, an embodiment can alternatively be described using the language "consisting essentially of" or "consisting of."

The use of the terms "include," "includes", "including," "have," "has," or "having" should be generally understood as open-ended and non-limiting unless specifically stated otherwise.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

It should be understood that the order of steps or order for performing certain actions is immaterial so long as the present teachings remain operable. Moreover, two or more steps or actions may be conducted simultaneously.

Unless defined otherwise all technical and scientific terms used herein have the same meaning as commonly understood to one of ordinary skill in the art to which the presently described subject matter pertains.

A main breakthrough of the present subject matter is that it provides a synthetic method to synthesize aggregation-induced emission polymers from simple, inexpensive, AIE-inactive monomers. It is achieved by in situ generation of AIEgen triphenylacrylonitrite through polymerization. With AIE properties, the obtained poly(triphenylacrylonitrite) shows high fluorescent intensity in aggregated and solid state. What's more, the obtained polymers show excellent thermal property and high solubility in common organic solvents. Various polymer industries, which aim to provide thermally stable fluorescent polymer materials, will directly benefit from this technology.

The present subject matter can further produce thermally stable emissive fluorescent polymers from simple, inexpensive and non-emissive monomers.

The synthetic routes described herein can tolerate a broad monomer scope. Poly(triphenylacrylonitrite) with different structures and emissive colors can be obtained.

The polydispersity index (PDI) of the polymers obtained herein is quite big. Better catalyst systems and reaction conditions may further improve the efficiency and narrow the distribution of molecular weights.

The present poly(triphenylacrylonitrite) polymers have characteristics such as high molecular weight, high thermal stability, in-situ generation of aggregation-induced emission property and fluorescent photopatterning.

In the present subject matter, a facile, one-pot and three-component polymerization route for in-situ generation of polymers with aggregation induced emission characteristics was developed. The polycoupling of dibromoarenes, internal diynes and potassium ferrocyanide was catalyzed by palladium acetate and sodium bicarbonate and proceeded smoothly in dimethylacetamide under nitrogen at 120° C., producing poly(triphenylacrylonitrite)s (PTPANs) with high molecular weights of up to 223,000 in high yields of up to 84%. This polymerization method enjoys the remarkable advantages of high reaction rate and efficiency, as well as broad monomer scope. Model reaction was carried out to aid the structured characterization and property investigation of the obtained polymers.

All the polymers possess good solubility in common organic solvents and remarkable thermal stability, losing merely 5% of their weight at high temperatures of up to 513° C. They are well soluble in common organic solvents and can easily form thin-films, which exhibit high refractive indices (1.6482-1.7682). Thanks to the triphenylethene chromophore in-situ generated during the polymerization, these polymers are AIE-active and show strong light emission in the solid state. While UV irradiation of the polymer thin films in air through upper masks photo-oxidizes the exposed parts and quenches their light emission, all unexposed parts remain emissive. Two-dimensional fluorescent patterns with good resolution are thus generated.

In the present subject matter, an efficient polymerization route for in situ generated AIE-active PTPANs by palladium-catalyzed three-component polyarylcyanations of diynes is described. This polymerization route enjoys the advantages of mild reaction conditions, high efficiency, simple starting materials, and broad monomer scope. By changing the monomer structures, the emission of P1/2/3 can be tuned from green to yellow. All of the synthesized P1/2/3 polymers possess high RI values and excellent thermal stability, are photosensitive, and can generate well-resolved fluorescent patterns by photolithography of their emissive thin films.

As can be seen in the following examples, the present subject matter describes the synthesis and properties of a new type of polymer, poly(triphenylacrylonitrite)s or PTPANs. Some key features of preferred embodiments include new polymer structures; in situ generation of AIE characteristics; high efficiency, one-pot reaction, broad monomer scope; high molecular weight polymer materials; tunable fluorescent emission color; high thermal stability; high reflective index; and fluorescent photopattern.

In an embodiment, the present subject matter is directed to a polymer, wherein the polymer is poly(triphenylacrylonitrite)s (PTPANs) and comprises a backbone structure of

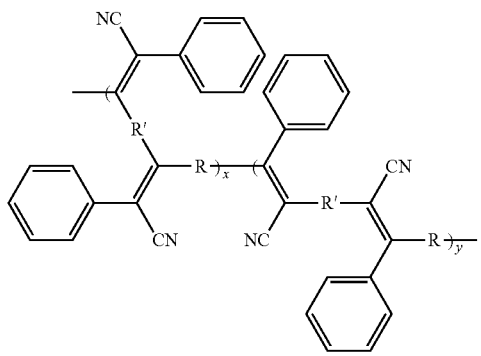

P1a-d/2a-b/3 wherein x and y are integers;

wherein each R is independently selected from the group consisting of

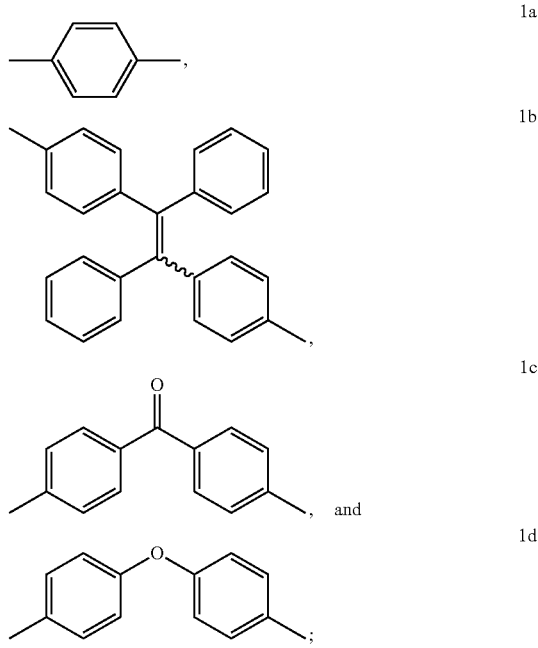

and wherein each R' is independently selected from the group consisting of

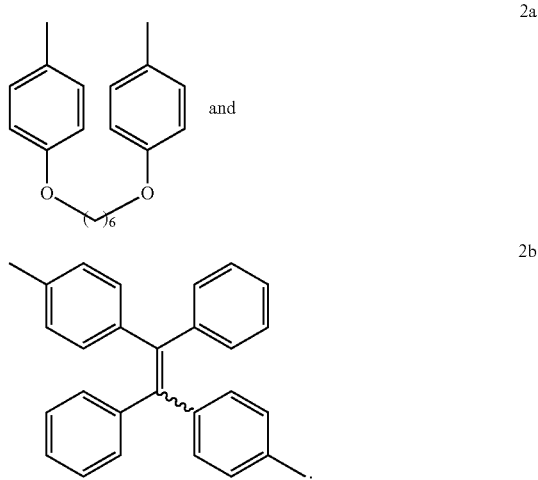

In an embodiment, the polymer is selected from the group consisting of P1a/2a/3, P1b/2a/3, P1c/2a/3, P1d/2a/3, and P1a/2b/3.

In an embodiment, the polymer exhibits aggregation induced emission characteristics. In an embodiment, the polymer has a high molecular weight. In an embodiment, the polymer has a tunable emission color. In an embodiment, the polymer has a high thermal stability with a degradation temperature of above 410° C. In an embodiment, the polymer has a refractive index of 1.6482-1.7682 at a wavelength of 632.8 nm. In an embodiment, the polymer is photosensitive. In an embodiment, the polymer may be used for fluorescent photopatterning. In an embodiment, the polymer may be used as a thin film.

An embodiment of the present subject matter is directed to a method of synthesis of poly(triphenylacrylonitrite)s (PTPANs) comprising:

polycoupling dibromoarenes, internal diynes, and potassium ferrocyanide, resulting in polycoupled dibromoarenes, internal diynes, and potassium ferrocyanide; and producing poly(triphenylacrylonitrite)s (PTPANs) by catalysis of the polycoupled dibromoarenes, internal diynes, and potassium ferrocyanide with palladium acetate and sodium bicarbonate, wherein the catalysis is allowed to proceed in dimethylacetamide under nitrogen at a prescribed temperature for a prescribed time.

In an embodiment, the prescribed temperature is 120° C. In an embodiment, the prescribed time is 6-24 hours. In an embodiment, the prescribed time is 6 hours.

In an embodiment, the dibromoarenes have a structure of

Br—R—Br wherein R is selected from the group consisting of

1a

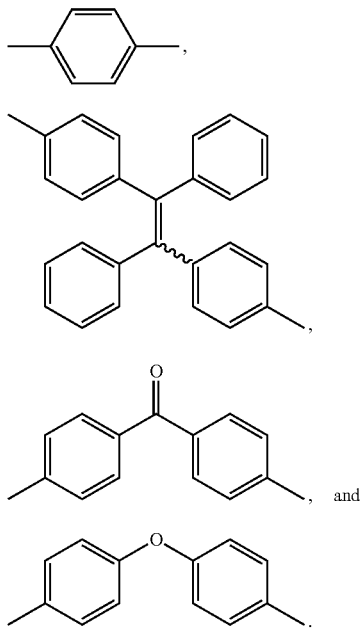

1b

1c

, and

1d

In an embodiment, the internal diynes have a structure of

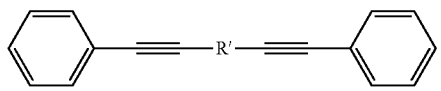

wherein R' is selected from the group consisting of

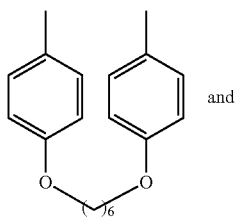

2a and

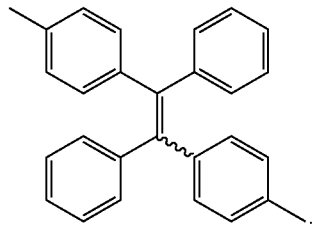

2b

.

In an embodiment, the synthesis is a step polymerization with fast monomer consumption and slow polymer growth. In an embodiment, the synthesis has a high reaction rate. In an embodiment, the synthesis has a yield of 60-84%. In an embodiment, the PTPANs synthesized have high molecular weights of up to 223,000.

Polymerization

To develop the polyarylcyanation of internal diyne with aryl dibromide and $K_4[Fe(CN)_6]$ into a new synthetic tool for preparing AIE polymers, the reaction conditions using 1a, 2a, and 3 as model monomers were optimized. The concentration effect on the polymerization was then examined. Surprisingly, when the polymerization was carried out at a concentration 1a and 2a of higher than 0.25 M with an excess amount of 3, gelation occurred after 3 hours (Table 1, entry 1-2). This demonstrates the high reaction rate of such polymerization. Dilution helps to solve the problem, and a high molecular weight ($M_w$=9 100) polymer was isolated in a high yield (81%) at a lower concentration of 0.2 M (Table 1, entry 3). Since further lowering the monomer concentration results in a dramatic decrease in both the polymer yield and molecular weight (Table 1, entry 4-5), 0.2 M was chosen as the optimum monomer concentration of 1a and 2a for further investigation.

TABLE 1

Concentration effect on the polymerization [a]

| entry | [1a] (M) | [2a] (M) | [3] (M) | yield (%) | $M_n$ | $M_w$ | $M_w/M_n$ |
|---|---|---|---|---|---|---|---|
| 1 | 0.375 | 0.375 | 0.225 | gel | | | |
| 2 | 0.25 | 0.25 | 0.15 | gel | | | |
| 3 | 0.20 | 0.20 | 0.12 | 81.0 | 9,400 | 45,900 | 4.9 |
| 4 | 0.15 | 0.15 | 0.09 | 75.2 | 7,700 | 25,700 | 3.4 |
| 5 | 0.10 | 0.10 | 0.06 | 60.0 | 4,100 | 7,300 | 1.8 |

[a] Carried out in dimethylacetamide under nitrogen at 120° C. for 6 h in the presence of 4 mol % of Pd(OAc)$_2$ and 2.5 equiv. of Na$_2$CO$_3$.

Potassium Ferrocyanide (3), an inorganic compound, serves as an environmentally friendly cyanation reagent and testing its ability to provide CN⁻ ions in organic solvent is of interest. The polymerization of 1a and 2a in the presence of 0.033 M of 3, which corresponds to 1.0 equivalent of CN⁻ ion, generated a polymer with a moderate molecular weight of 10,500. Increasing the amount of $K_4[Fe(CN)_6]$ affords better results (Table 2, entry 3), which is understandable because it is unlikely for the complex to release all the ligand due to the increasing electrostatic attraction between the cation and the anion. Further increasing the concentration of 3 exerts little improvement on the molecular weight (Table 2, entry 4). Thus, the concentration of 3 was fixed at 0.12 M.

TABLE 2

Effect of CN⁻ loading on the polymerization [a]

| entry | equiv. of CN⁻ | yield (%) | $M_n$ | $M_w$ | $M_w/M_n$ |
|---|---|---|---|---|---|
| 1 | 1.0 | 79.4 | 5,100 | 10,500 | 1.9 |
| 2 | 3.0 | 80.7 | 5,400 | 11,900 | 2.0 |
| 3[b] | 3.6 | 81.0 | 9,400 | 45,900 | 4.9 |
| 4 | 4.0 | 80.3 | 9,600 | 46,800 | 4.9 |

[a] Carried out in dimethylacetamide under nitrogen at 120° C. for 6 h in the presence of 4 mol % of Pd(OAc)₂ and 2.5 equiv. of Na₂CO₃. [1a] = [2a] = 0.2M.
[b] Data taken from Table 1, entry 3.

A series of experiments tracking the time course on the polymerization were performed thereafter. While the number-average molecular weight ($M_n$) was enhanced gradually with prolonging the reaction time, the weight-average molecular weight ($M_w$) increased dramatically, rising the polydispersity index by almost four times from 4.9 at 6 hours to 16.7 at 24 hours (Table 3, entry 1-4). The isolated yield, on the other hand, remained almost the same at all the reaction times tested. These phenomena are indicative of a step polymerization with fast monomer consumption but slow polymer growth.

TABLE 3

Time course on the polymerization[a]

| entry | time (h) | yield (%) | $M_n$ | $M_w$ | $M_w/M_n$ |
|---|---|---|---|---|---|
| 1[b] | 6 | 81.0 | 9,400 | 45,900 | 4.9 |
| 2 | 12 | 83.9 | 12,100 | 117,800 | 9.8 |
| 3 | 18 | 81.3 | 9,900 | 147,400 | 15.0 |
| 4 | 24 | 82.5 | 13,400 | 223,000 | 16.7 |

[a] Carried out in dimethylacetamide under nitrogen at 120° C. in the presence of 4 mol % of Pd(OAc)₂ and 2.5 equiv. of Na₂CO₃ to that of [1a]. [1a] = [2a] = 0.2M, [3] = 0.12M.
[b] Data taken from Table 2, entry 3.

The effect of solvent on the polymerization was shown in Table 4. While no polymer was generated in 1,4-dioxane, o-xylene, and chlorobenzene, the polymerization performed in DMAc gives a high molecular weight polymer in a high yield. Although a polymer with a high $M_w$ was also isolated in NMP, the yield was rather low. These suggest that the polymerization is better to be carried out in polar solvents, among which DMAc is the best.

TABLE 4

Solvent effect on the polymerization[a]

| entry | solvent | yield (%) | $M_n$ | $M_w$ | $M_w/M_n$ |
|---|---|---|---|---|---|
| 1 | NMP | 16.6 | 10,400 | 134,000 | 13.0 |
| 2[b] | DMAc | 82.5 | 13,400 | 223,000 | 15.8 |
| 3 | DMF | 54.4 | 4,000 | 7,100 | 2.1 |
| 4 | chlorobenzene | trace | | | |
| 5 | 1,4-dioxane | trace | | | |
| 6 | o-xylene | trace | | | |

[a] Carried out under nitrogen at 120° C. for 24 h in the presence of 4 mol % equiv. of Pd(OAc)₂ and 2.5 equiv. of Na₂CO₃. [1a] = [2a] = 0.2M, [3] = 0.12M.
[b] Data taken from Table 3, entry 4.

Based on the above investigation, the optimized reaction conditions were adopted and the monomer scope was explored from a series of dibromoarenes and internal diynes (Scheme 1).

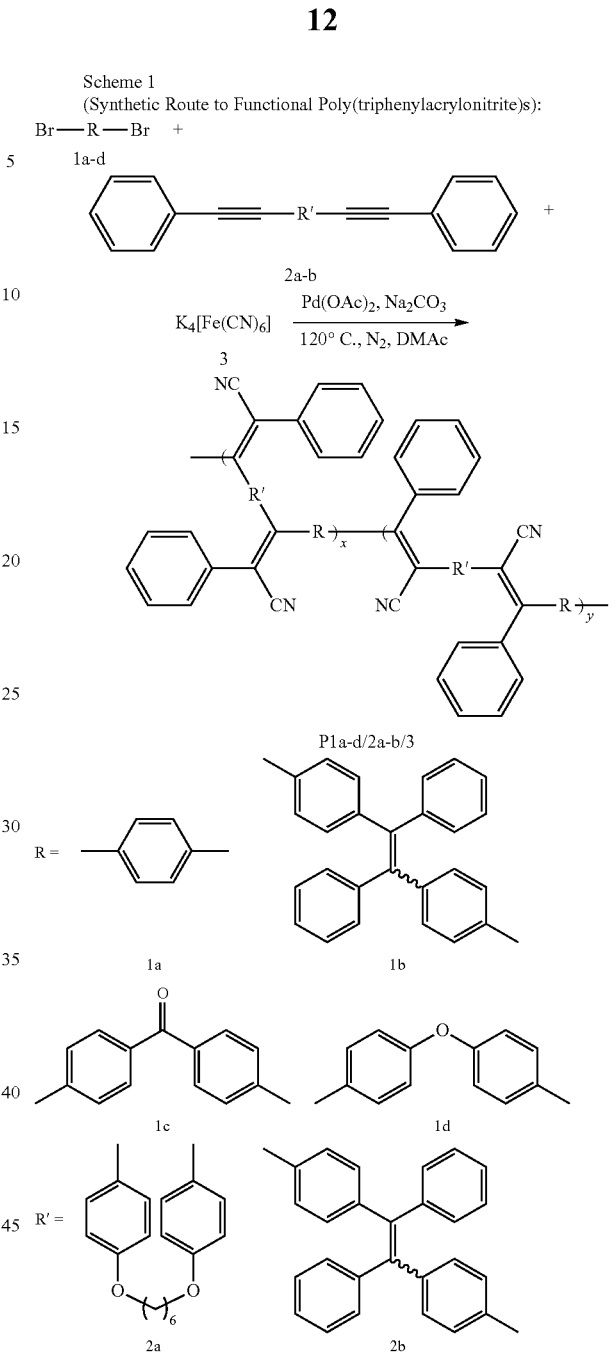

Monomers 1a-d are dibromoarenes with different electron density and conjugation. Monomer 2a is an internal diyne with a flexible alkyl chain as a spacer, but 2b, on the other hand, is a rigid TPE-containing diyne. Since other monomer combinations show higher reactivity than 1a/2a/3, gels are formed under optimized conditions. Thus, the monomer concentration was diluted by half to 0.1 M, and the reaction was terminated after 6 hours. By doing so, soluble, high molecular weight ($M_w$=41,000 to 97,500) polymers are obtained in satisfactory to high yields (Table 5, entry 2).

Because P1c/2a/3 and P1d/2a/3 carry an electron-withdrawing ketone group and an electron-donating oxygen atom, this polymerization thus shows high tolerance to monomers with different electron density structures. However, moderate polymerization results are only obtained in P1a/2b/3 (Table 5, entry 5). This may be due to the bulky and rigid structure of 2b, which imposes a steric effect on the propagation of the polymer chain. Despite its whole conjugated molecular structure, P1a/2b/3 is readily solubilized in common organic solvents. Thus, the results given in Table 5 demonstrate the huge potential of this polymerization with a wide monomer scope.

TABLE 5

Polymerization of different monomers[a]

| entry | monomer | yield (%) | $M_n$ | $M_w$ | $M_w/M_n$ |
|---|---|---|---|---|---|
| 1[b] | 1a/2a/3 | 60.0 | 4,100 | 7,300 | 1.8 |
| 2 | 1b/2a/3 | 84.1 | 20,600 | 97,500 | 4.7 |
| 3 | 1c/2a/3 | 67.4 | 9,900 | 41,000 | 4.1 |
| 4 | 1d/2a/3 | 82.4 | 12,000 | 45,800 | 3.8 |
| 5 | 1a/2b/3 | 60.5 | 4,600 | 11,700 | 2.6 |

[a]Carried out in dimethylacetamide under nitrogen at 120° C. for 6 h in the presence of 4 mol % of Pd(OAc)$_2$ and 2.5 equiv. of Na$_2$CO$_3$. [1] = [2] = 0.10M, [3] = 0.06M.
[b]Data taken from Table 1, entry 5.

Model Reaction

To gain an insight into the structures of PTPANs formed, a model reaction was carried out using 1-methoxy-4-(phenylethynyl)benzene (5) with bromobenzene (4) and 3 under the same synthetic conditions for the polymers (Scheme 2). Two isomeric compounds (6a and 6b), in a molar ratio of 6a to 6b of 9:1, were obtained according to $^1$H NMR analysis (FIG. 2C). This indicates the high regioselectivity of this arylcyanation reaction. The needle-shaped single crystals of 6a were obtained by slow solvent diffusion of dichloromethane/hexane into a mixture of 6a and 6b at room temperature. The spectroscopic and single-crystal X-ray diffraction results unambiguously confirm the structure of 6a (Scheme 2). The single-crystal structure of 6a is shown in FIG. 3O.

Scheme 2 (Synthesis of Model Compound 6):

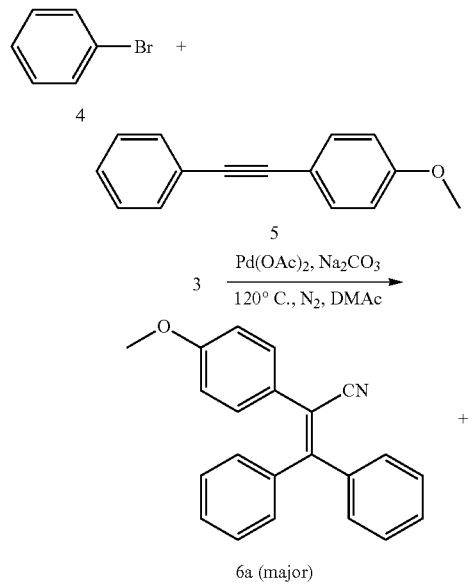

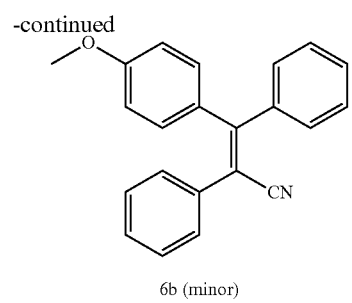

6b (minor)

Structural Characterization

All the polymers were fully characterized by IR and NMR spectroscopies and gave good results corresponding to their molecular structures. The IR and NMR spectra of P1a/2a/3 are presented as examples. FIG. 1 shows the IR spectra of monomers 1a and 2a, the model compound 6, and the corresponding polymer P1a/2a/3. The small peak at 2201 cm$^{-1}$ in the spectrum of 2a is due to the stretching vibration of its C≡C bond (FIG. 1B). Although the absorption band of the cyano group occurs at a similar wavenumber of around 2200 cm$^{-1}$, its intensity is much stronger, as presented in FIGS. 1C and 1D. The strong absorption band located at 2206 cm$^{-1}$ confirms the presence of a C≡N group in both 6 and P1a/2a/3, denoting the successful integration of a C≡N group into the model compound and the polymer structure. Meanwhile, the IR spectra of P1a/2a/3 are almost the same as that of model compound 6, further confirming the structure of P1a/2a/3.

Figure 2:
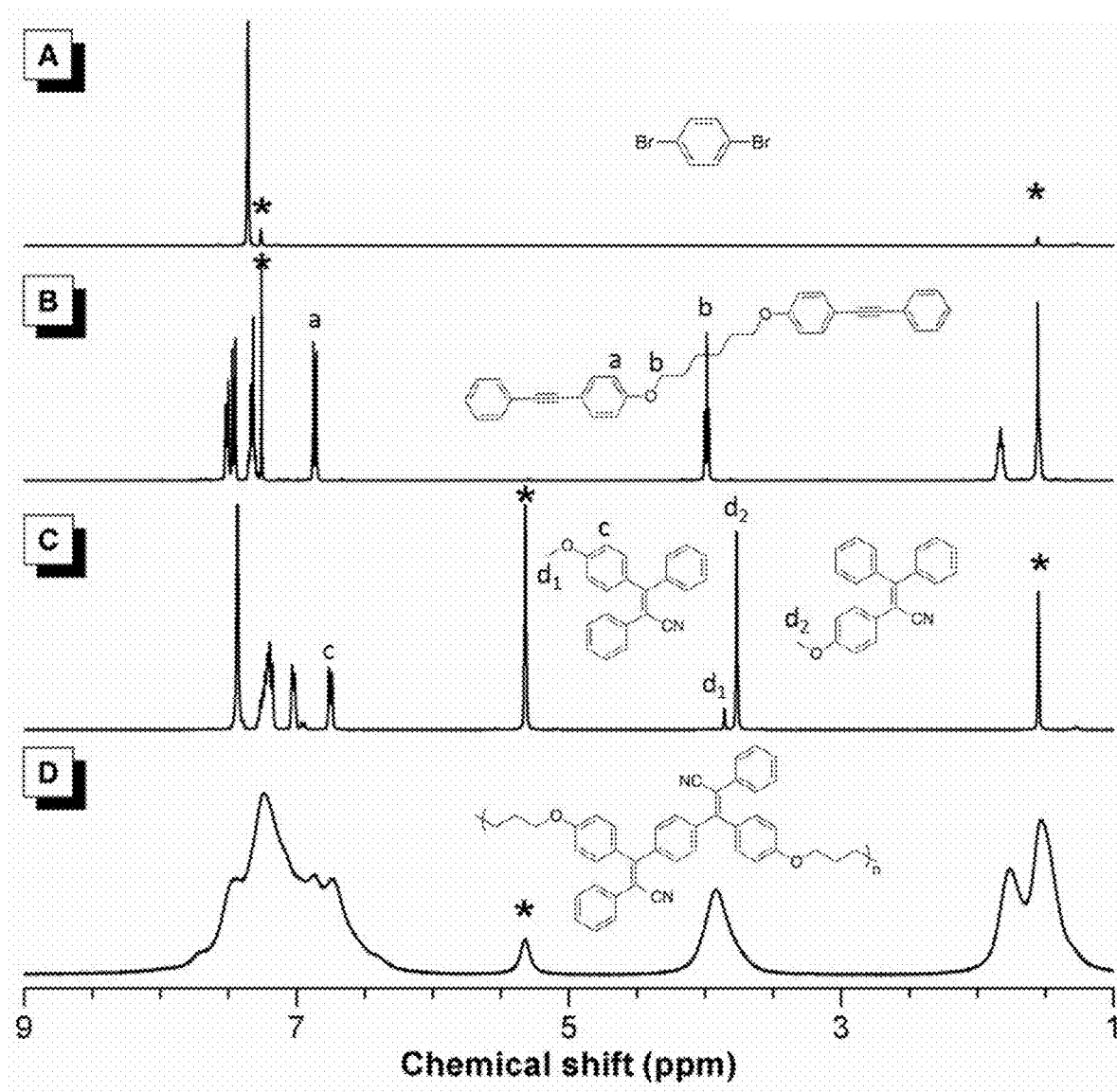
FIG. 2 shows $^1$H NMR spectra of (A) 1a, (B) 2b, (C) 6, and (D) P1a/2a/3 in (A and B) CDCl$_3$ and (C and D) CD$_2$Cl$_2$. The solvent peaks were marked with asterisks.

The $^1$H NMR and $^{13}$C NMR analyses provide more detailed structural information. FIG. 2 shows the $^1$H NMR spectra of the monomers (1a and 2a), model compound (6) and polymer (P1a/2a/3). Since this is an arylcyanation addition reaction to internal alkyne, the $^1$H NMR spectra of 6 and P1a/2a/3 resemble largely 2a. The absorption peaks of P1a/2a/3 are broad, due to its high molecular weight. The peaks at around δ 4.00 in the spectra of 2a, 6, and P1a/2a/3 correspond to the $d_1$ and $d_2$ resonances of the protons attached to an oxygen atom. Using the peak integrals in FIG. 2C, the molar ratio of 6a and 6b is 9:1. This indicates the high stereoselectivity of this arylcyanation reaction. The CN group would prefer to attach an alkene with an electron-donating group, corresponding well with the proposed reaction mechanism of arylpalladium(II) intermediate. Although it is difficult to elucidate the stereoregularity of the polymer due to the broadness of the absorption peak and hence peak overlapping, it is anticipated that P1a/2a/3 also adopts a stereoregular structure.

Figure 3:
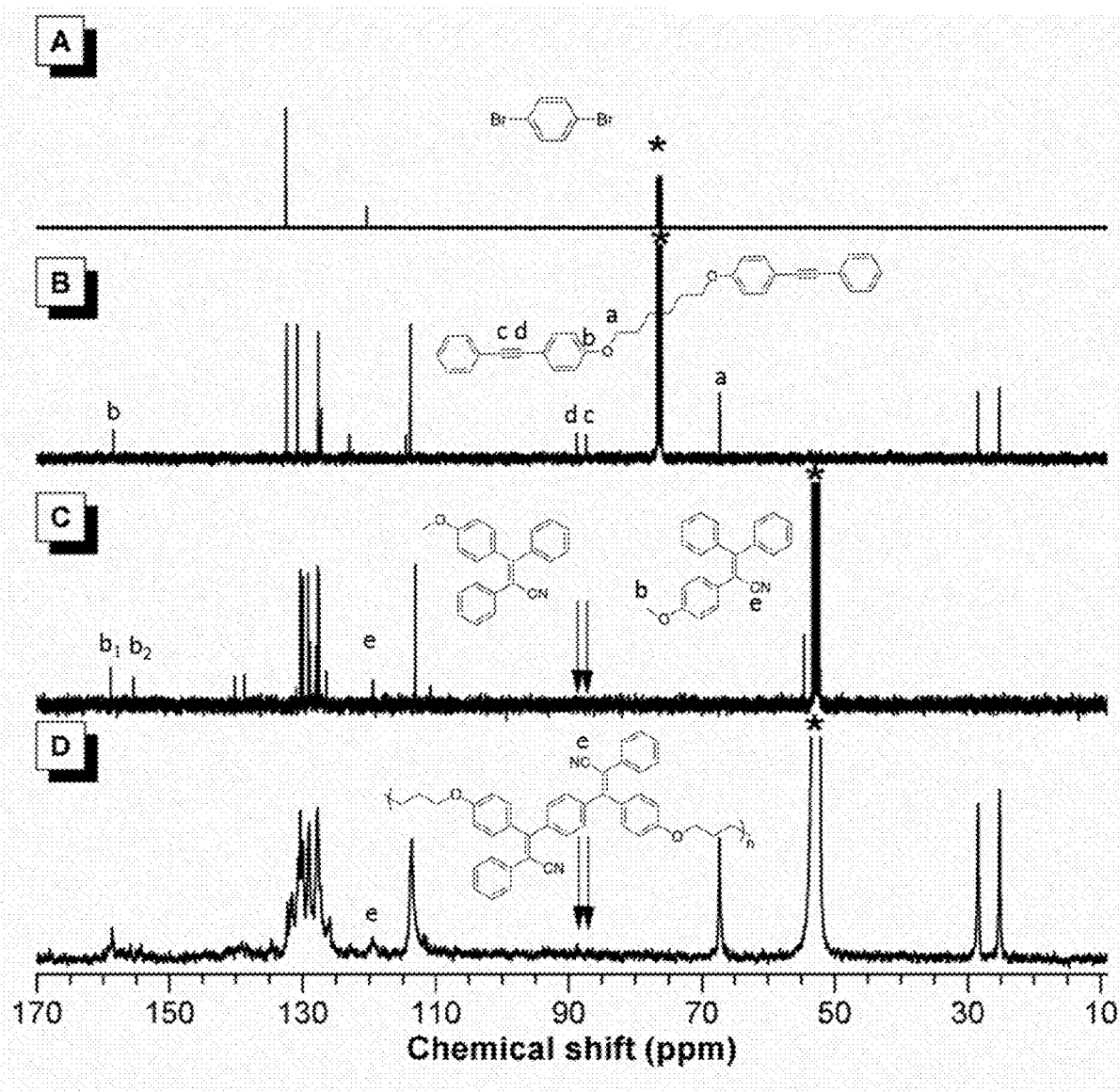
FIG. 3 shows $^{13}$C NMR spectra of (A) 1a, (B) 2b, (C) 6, and (D) P1a/2a/3 in (A and B) CDCl$_3$ and (C and D) CD$_2$Cl$_2$. The solvent peaks were marked with asterisks.

More convincing evidence of the proposed polymer structure comes from the $^{13}$C NMR analysis (FIG. 3). The complete absence of the C≡C resonance peak in 6 and P1a/2a/3 further confirms the occurrence of the arylcyanation addition reaction. Besides, peaks associated with the resonance of the cyano carbon are observed at δ 120.64 and 119.51 in the spectra of 6 and P1a/2a/3, respectively. This demonstrates the successful incorporation of the CN group, matching with the information given by the IR analysis described above. The IR and NMR data of other polymers all solidly confirm their respective structures (FIG. 11-22).

Solubility and Thermal Stability

Although P1/2/3 polymers are constructed mainly from aromatic rings, all show good solubility in common organic solvents such as THF, dichloromethane, chloroform, etc. This is due to the presence of twisted triphenylacrylonitrile units in the polymer backbone, as suggested by the crystal structure of the model compound. Such a twisted conformation endows large free volume to accommodate more solvent molecules for interaction, thus enhancing the solubility of the polymers.

Figure 4:
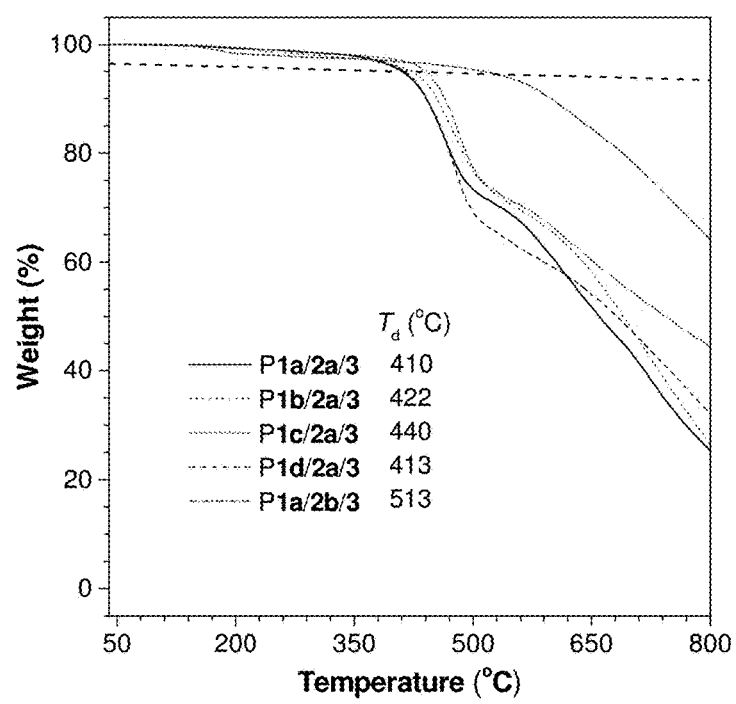
FIG. 4 shows TGA thermograms of P1/2/3 polymers recorded under nitrogen at a heating rate of 10° C./min.

High thermal stability is a key feature of high performance polymer materials which guarantee their applications in real engineering conditions. The thermal stabilities of P1/2/3 polymers are evaluated by TGA analysis. FIG. 4 shows the thermal degradation process of P1/2/3 polymers when being heated from 50° C. to 800° C. under nitrogen atmosphere. Degradation temperature ($T_d$), which is defined as the temperature for 5% weight loss, is used for the thermal stability analysis. All of the poly(triphenylacrylonitrite)s show very high thermal stability with $T_d$ of above 410° C., which can meet various harsh engineering conditions in the fields of semiconductor, high temperature coating, industrial machinery, etc. Notably, the $T_d$ of P1a/2b/3 reaches 513° C., which is comparable to Kapton® ($T_d$~520° C.), a well-known high thermal resistant polyimide. Additionally, P1a/2b/3 renders 64% of its weight even after being heated to 800° C., possibly due to the thermal-induced polymerization of the cyano group at high temperature, which crosslinks it to further enhance its resistance to thermolytic attack. The combination of good solubility and excellent thermal stability enables PTPANs as light, versatile alternatives compared to metal, ceramics, and old generation polymers.

Optical Property

Figure 23:
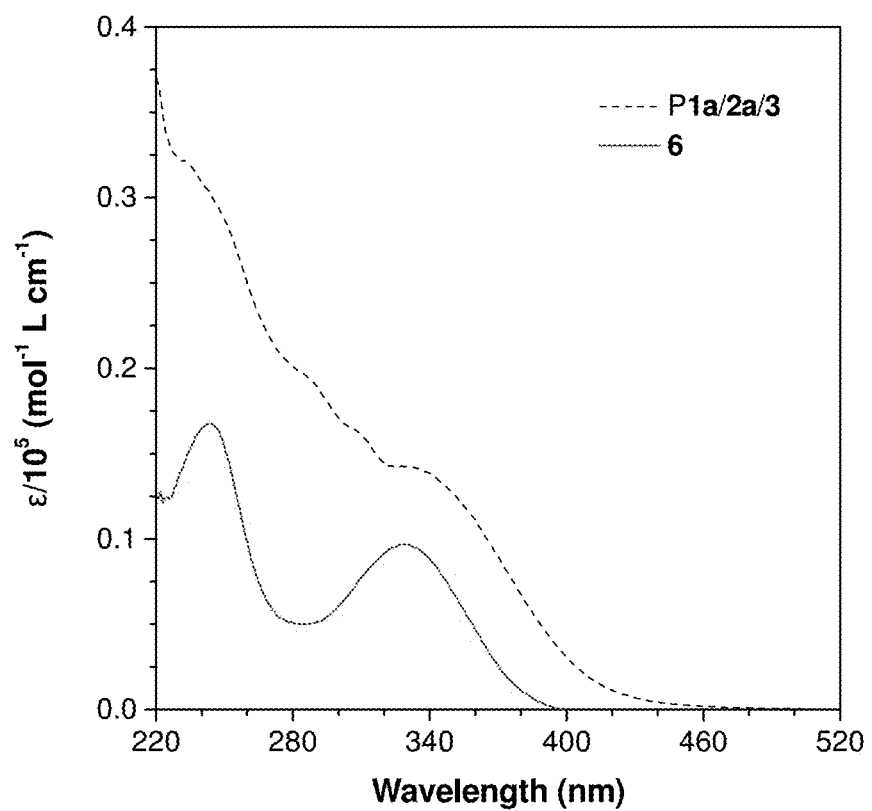
FIG. 23 shows absorption spectra of P1a/2a/3 and model compound 6 in THF solutions.
Figure 24:
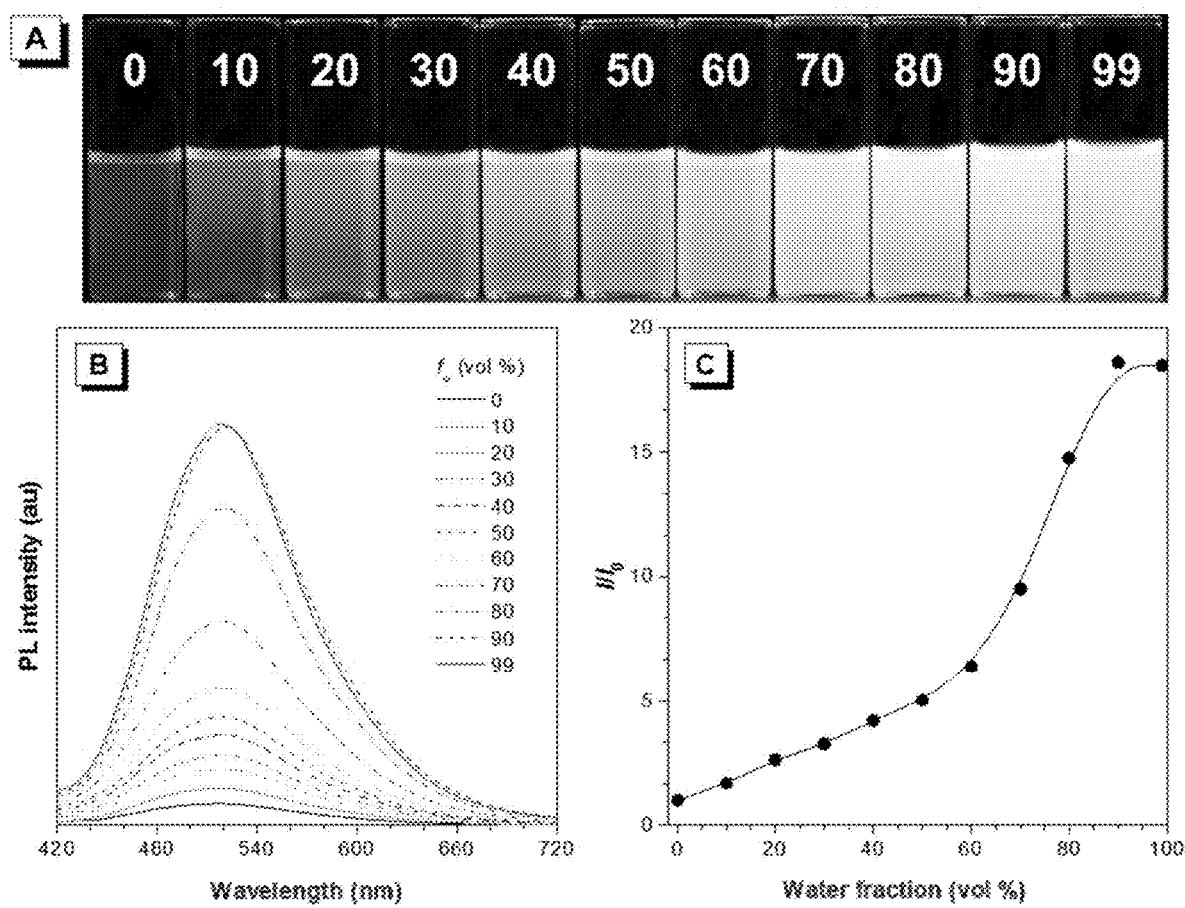
FIG. 24 shows (A) photographs of P1b/2a/3 in THF/water mixtures with different water fractions (f$_w$) taken under 365 nm UV irradiation from a hand-held UV lamp; (B) emission spectra of P1b/2a/3 in THF/water mixtures with different water fractions. Solution concentration: 10 μM; excitation wavelength: 380 nm; and (C) plot of relative emission intensity (I/I$_0$) versus the composition of the THF/water mixture of P1b/2a/3.
Figure 25:
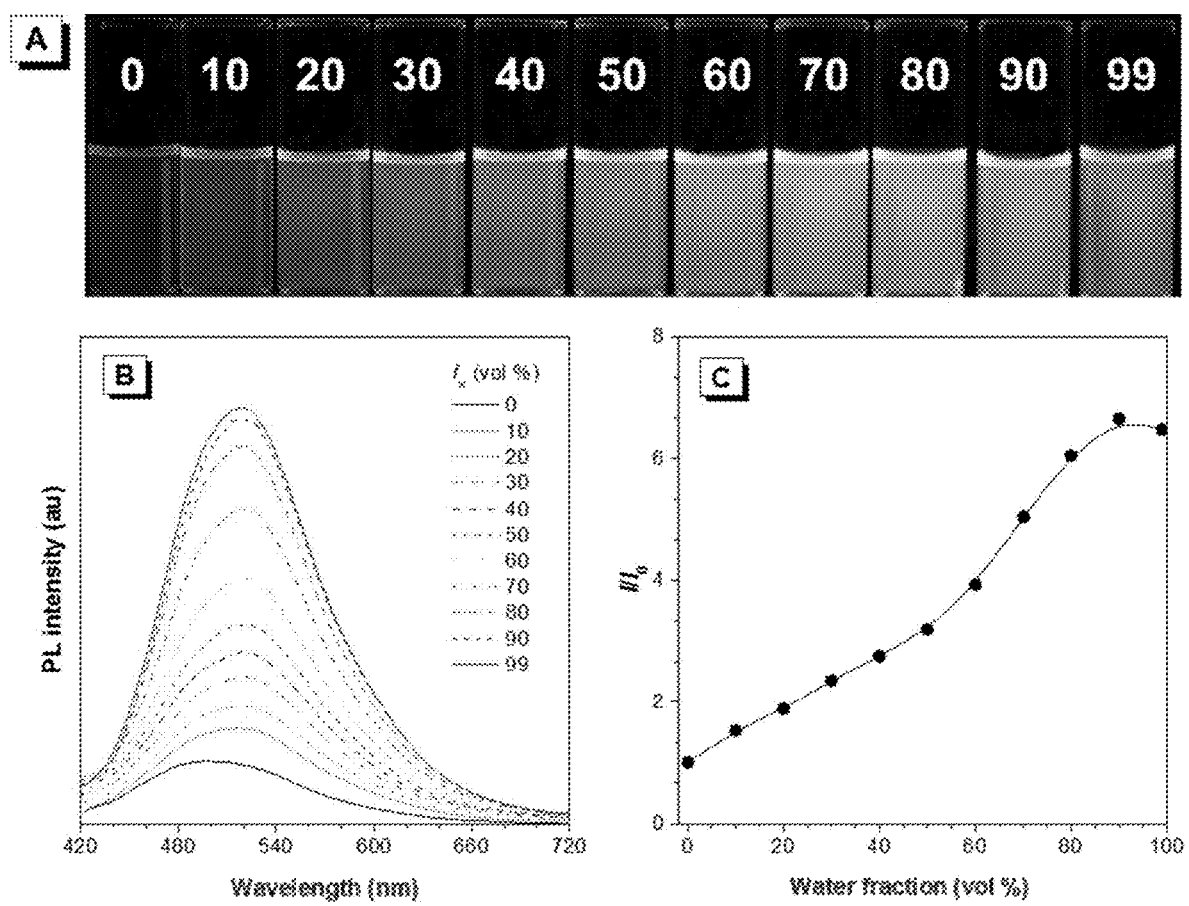
FIG. 25 shows (A) photographs of P1c/2a/3 in THF/water mixtures with different water fractions (f$_w$) taken under 365 nm UV irradiation from a hand-held UV lamp; (B) emission spectra of P1c/2a/3 in THF/water mixtures with different water fractions. Solution concentration: 10 μM; excitation wavelength: 380 nm; and (C) plot of relative emission intensity ($I/I_0$) versus the composition of the THF/water mixture of P1c/2a/3.
Figure 26:
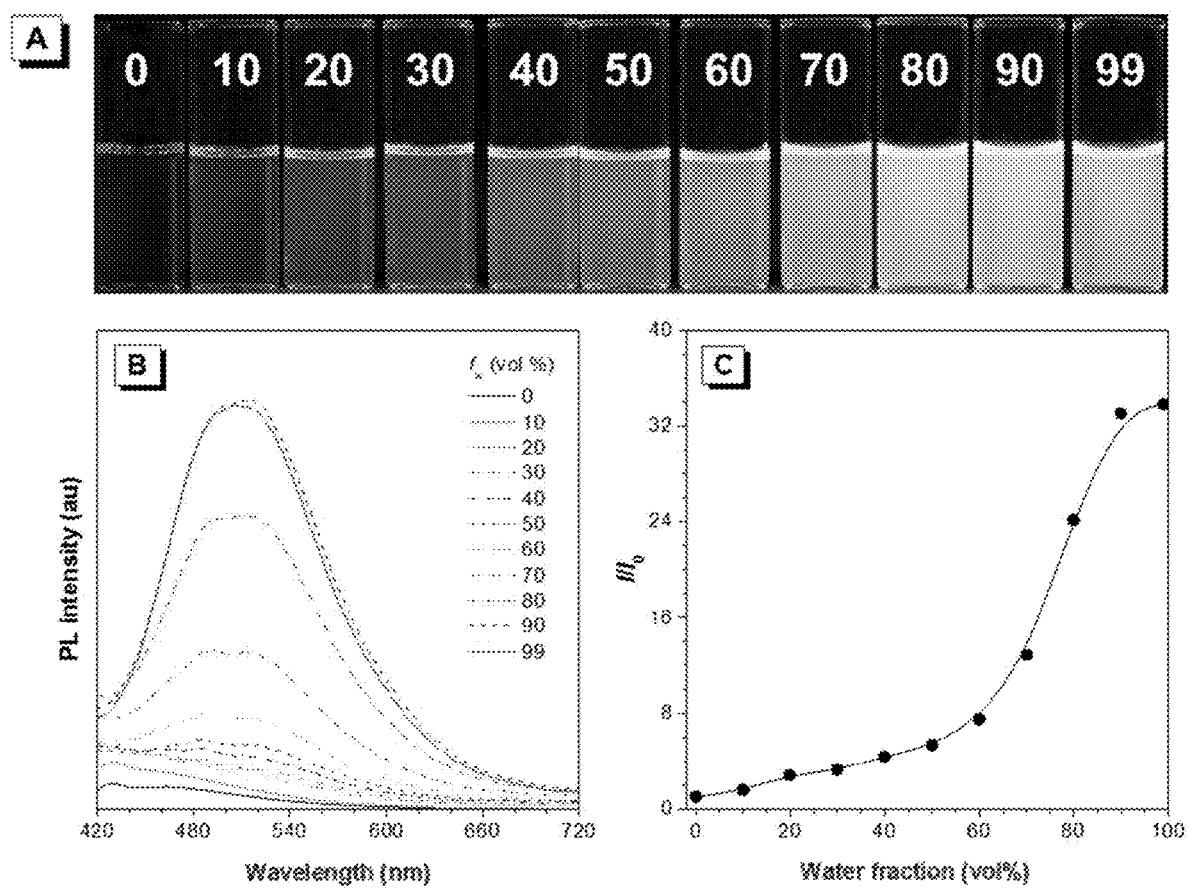
FIG. 26 shows (A) photographs of P1d/2a/3 in THF/water mixtures with different water fractions ($f_w$) taken under 365 nm UV irradiation from a hand-held UV lamp; (B) emission spectra of P1d/2a/3 in THF/water mixtures with different water fractions. Solution concentration: 10 μM; excitation wavelength: 380 nm; and (C) plot of relative emission intensity ($I/I_0$) versus the composition of the THF/water mixture of P1d/2a/3.
Figure 27:
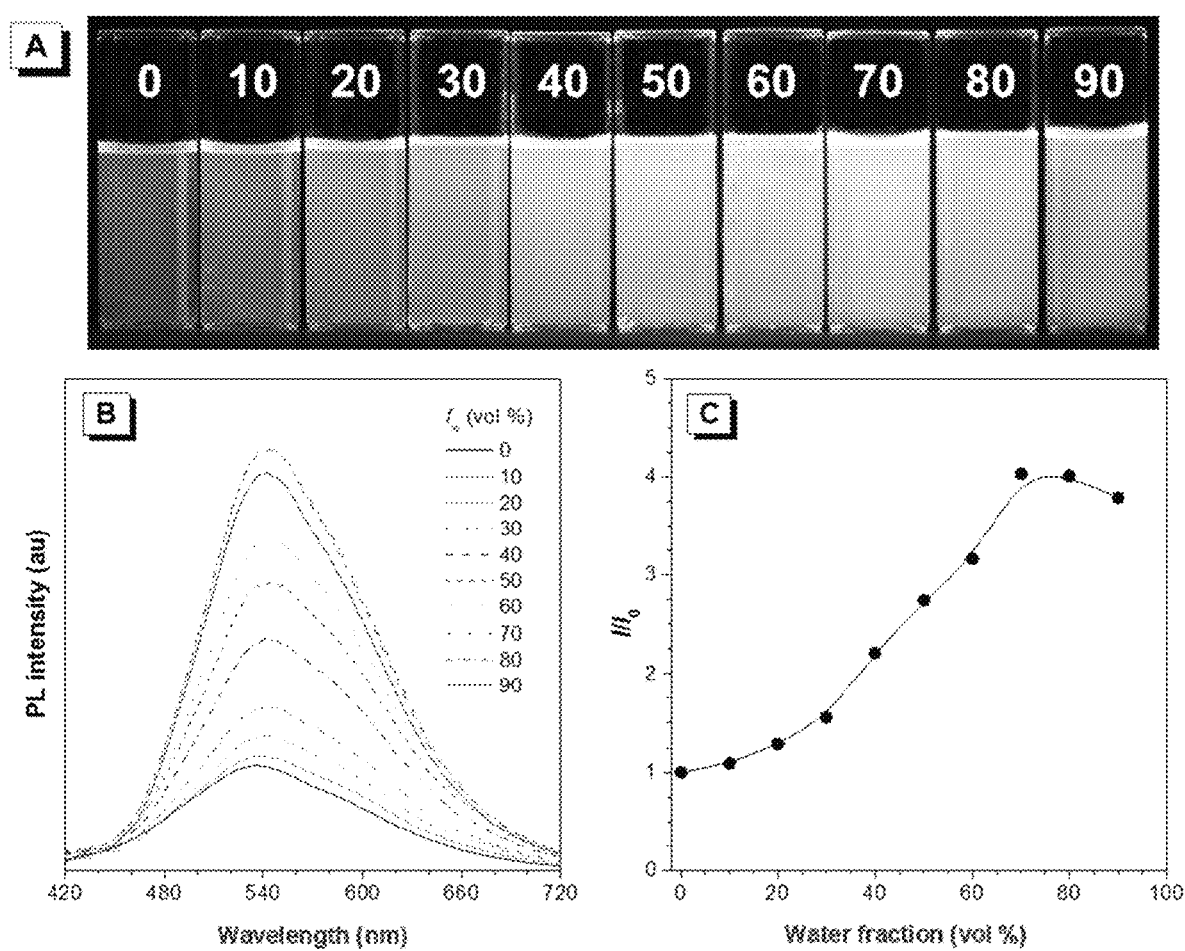
FIG. 27 shows (A) photographs of P1a/2b/3 in THF/water mixtures with different water fractions ($f_w$) taken under 365 nm UV irradiation from a hand-held UV lamp; (B) emission spectra of P1a/2b/3 in THF/water mixtures with different water fractions. Solution concentration: 10 μM; excitation wavelength: 380 nm; and (C) plot of relative emission intensity ($I/I_0$) versus the composition of the THF/water mixture of P1a/2b/3.

The absorption spectra of dilute THF solutions (10 μM) of 6 and P1a/2a/3 are shown in FIG. 23 while 6 exhibits an absorption maximum ($\lambda_{abs}$) at 330 nm. The $\lambda_{abs}$ of P1a/2a/3 occurs at a longer wavelength (~350 nm) with a stronger intensity, which is suggestive of its higher conjugation.

Figure 5:
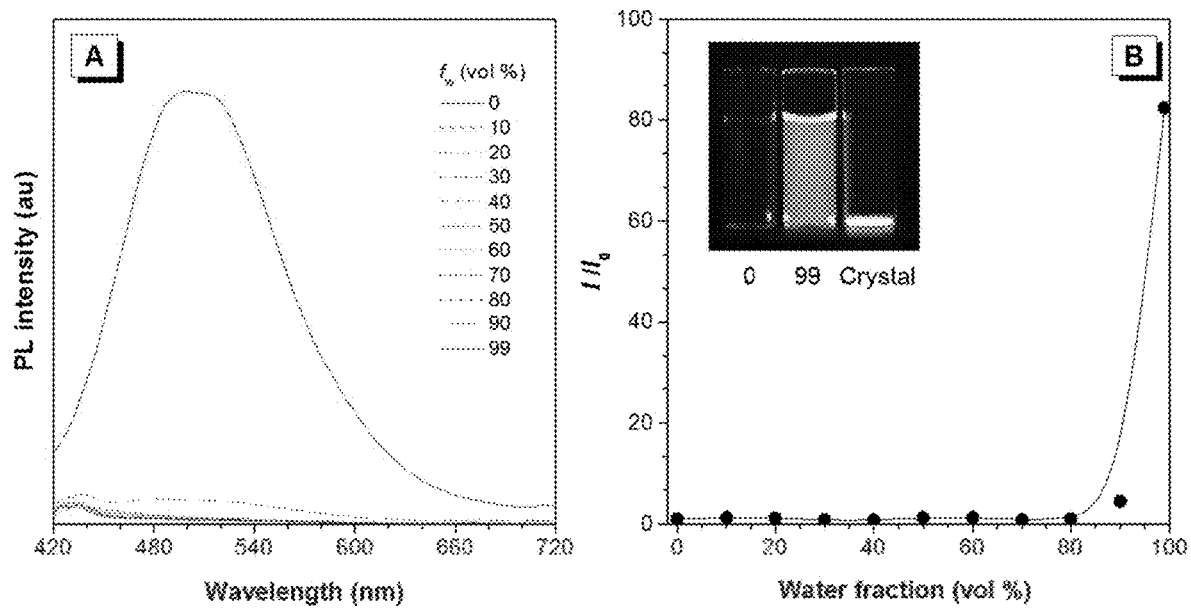
FIG. 5 shows (A) emission spectrum of 6 in THF/water mixtures with different water fractions (f$_w$). Solution concentration: 10 μM; excitation wavelength: 380 nm; and (B) plot of relative emission intensity (I/I$_0$) versus the composition of the THF/water mixture of 6. Insert in (B): Photographs of 6 in pure THF solution, THF/water mixture (1/99, v/v) and the crystal state taken under 365 nm UV irradiation from a hand-held UV lamp.

The light-emitting properties of 6 were investigated in THF and THF/water mixtures with different water fractions ($f_w$). As a derivative of triphenylethene, 6 is also anticipated to be AIE-active. As shown in FIG. 5A, the pure THF solution of 6 was nonemissive under UV excitation. However, when an increasing amount of a poor solvent of water was added into the THF solution of 6, the molecule starts to aggregate. Due to the restriction of intramolecular motion in the aggregated state, the emission of 6 was increased dramatically at a water fraction larger than 80%. At $f_w$ of 99%, the emission intensity is 80-fold higher than that in THF solution. Clearly, the emission of 6 is induced by aggregate formation and it is AIE-active. Notably, the crystals of 6 show much stronger emission than their isolated species in solution and aggregates in the suspension, as suggested by the photograph shown in the inset of FIG. 5B. The emission maximum of 6 is located at around 500 nm, which is 70 nm red-shifted from that of TriPE due to the intermolecular charge transfer from the electron-donating methoxy group to the electron-withdrawing cyano moiety.

Figure 6:
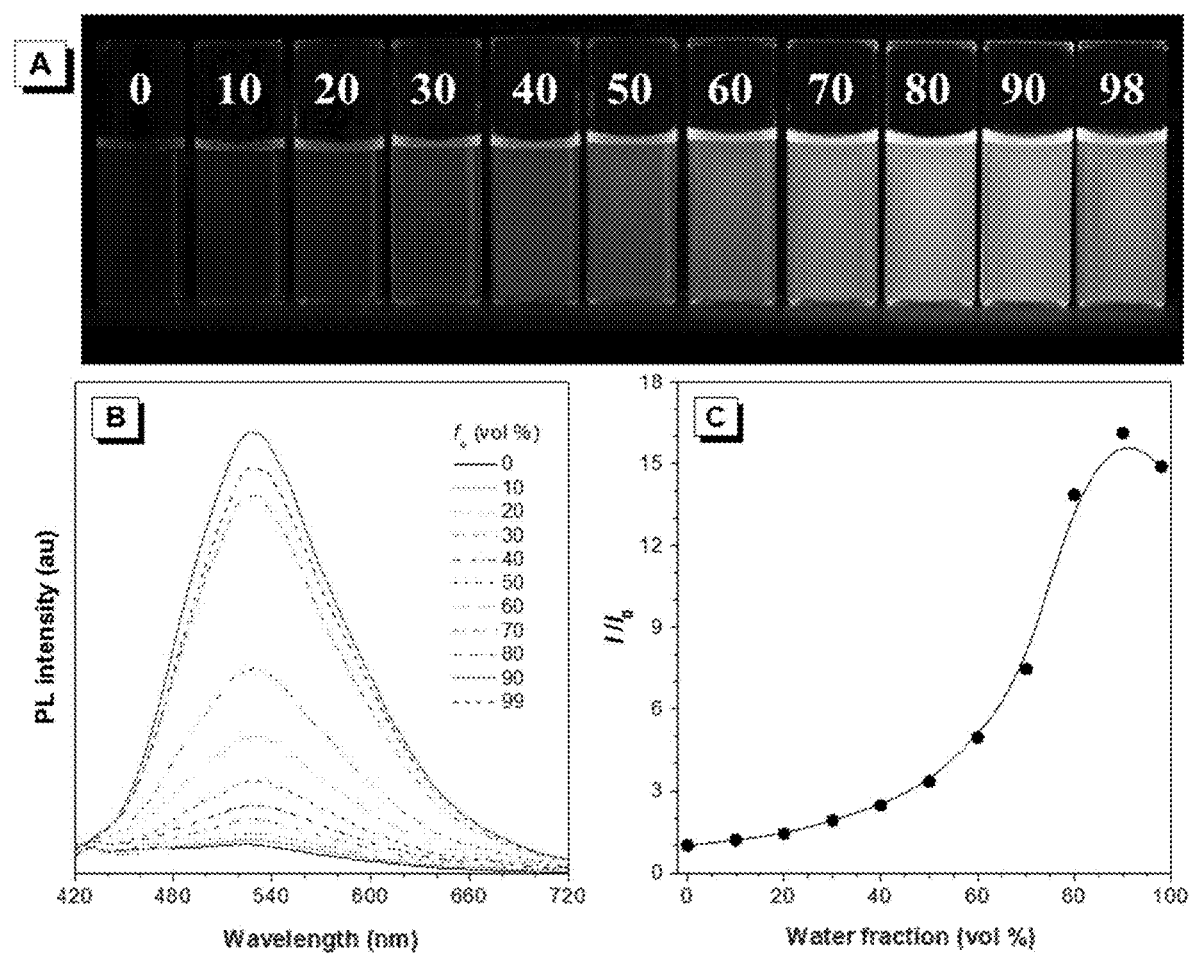
FIG. 6 shows (A) photographs of P1a/2a/3 in THF/water mixtures with different water fractions (f$_w$) taken under 365 nm UV irradiation from a hand-held UV lamp; (B) emission spectra of P1a/2a/3 in THF/water mixtures with different water fractions. Solution concentration: 10 μM; excitation wavelength: 380 nm; and (C) plot of relative emission intensity (I/I$_0$) versus the composition of the THF/water mixture of P1a/2a/3.

Similar investigation was also carried out for P1a/2a/3. As illustrated in FIG. 6, P1a/2a/3 is also AIE-active, showing stronger green emission in the aggregate state. However, different from 6, whose emission only turns on in a THF/water mixture with high water content, the emission of P1a/2a/3 is gradually enhanced with the amount of water added. This is a common phenomenon for AIE polymers, since the rotation of the phenyl rings of the AIEgen is restricted by the polymer chain to some extent even in THF solution. Such common phenomenon further proves the restriction of intramolecular motion (RIM) as the mechanism for the AIE phenomenon. P1a/2a/3 shows similar emission behavior in different aggregate states with emission spectra all located at 530 nm. The highest emission enhancement of the polymer is achieved at 90% water content, being 16-fold higher than the THF solution. However, at very high water content, the hydrophobic polymer may form large aggregates, which decreases the effective dye concentration in the solution. This is probably the reason for the slight emission drop at 98% aqueous mixture.

Figure 7:
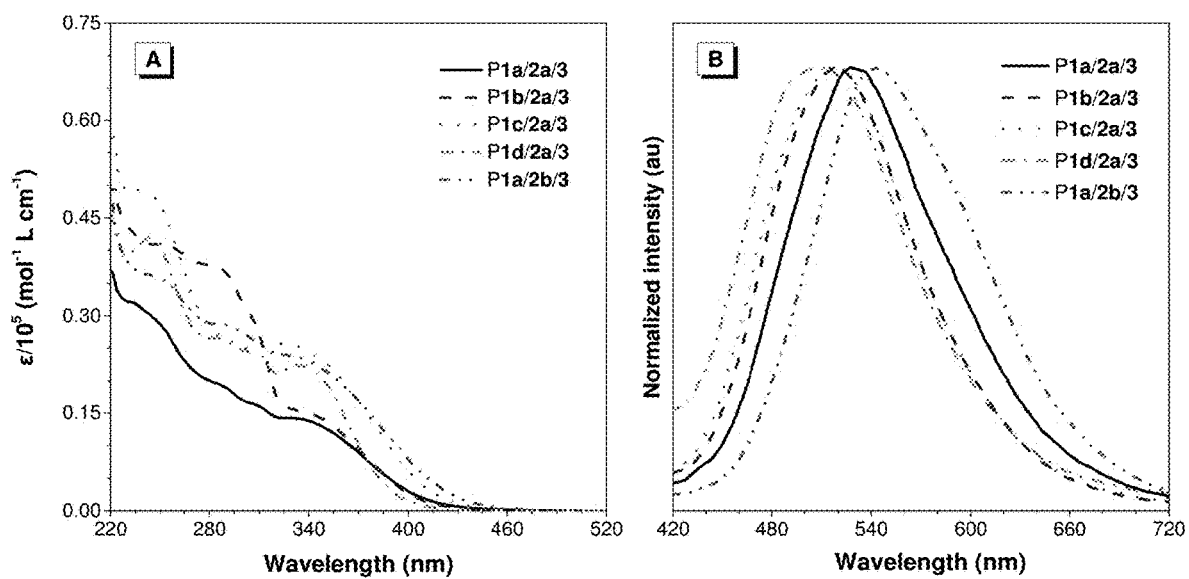
FIG. 7 shows (A) absorption spectra of P1/2/3 polymers in THF solutions; and (B) emission spectra of P1/2/3 polymers in THF/water mixtures (10/90, v/v). Solution concentration: 10 μM; excitation wavelength: 380 nm.
Figure 28:
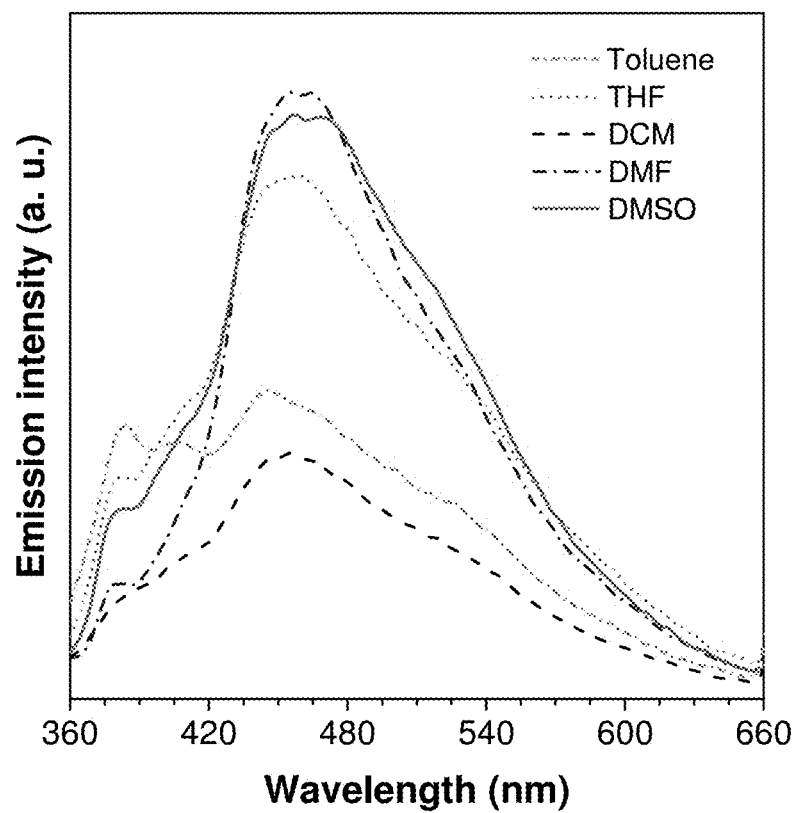
FIG. 28 shows emission spectra of P1d/2a/3 in solvents with different polarities.

Further investigation on the relationship between the polymer structure and photophysical property was carried out. Different monomers with light-emitting unit (1b and 2b), electron-withdrawing group (1c) and electron-donating group (1d) were utilized to synthesize polymers (P1a/2a/3, P1b/2a/3, P1c/2a/3, P1d/2a/3, and P1a/2b/3) (Scheme 1). Among them, P1a/2b/3 is a fully conjugated polymer without a flexible alkyl spacer. As expected, all of the polymers absorb at similar wavelength of 340 nm due to the presence of a similar chromophore along the polymer chain (FIG. 7A). All of the polymers are AIE-active, as demonstrated by their emission spectra and fluorescent photographs shown in FIGS. 24-27. Their normalized emission spectra are shown in FIG. 7B. Surprisingly, when the TPE unit (1b), electron-withdrawing carbonyl group (1c), and electron-donating alkoxy group (1d) are introduced, the resulting polymers (P1b/2a/3, P1c/2a/3, and P1d/2a/3) show bluer emission than P1a/2a/3, indicating their lower conjugation. For P1a/2b/3 with a fully conjugated structure, its emission occurs at a longer-wavelength of 540 nm and shows a strong yellow emission color due its extended electron conjugation. On the other hand, the similar spectra of P1c/2a/3 and P1d/2a/3 suggest that the D-A interaction between the alkoxy and the cyano groups is quite weak, which is also supported by poor solvatochromism for P1d/2a/3 (FIG. 28). As such, the emission of P1/2/3 polymers is primary dominated by the extent of conjugation rather than D-A interaction, and can be fine-tuned from green to yellow by utilizing different monomers.

Light Refraction

The refractive index (RI) is a very fundamental yet important criterion for key components, such as lenses and prisms, in any optical instrument that uses refraction. A high-refractive-index-polymer is defined as a polymeric material whose refractive index is greater than 1.50. Such polymers are in great demand for advanced optoelectronic fabrication, such as optical adhesives or encapsulants for organic light emitting diodes, photoresist for lithography, and microlen components for charge coupled devices or complementary metal oxide semiconductors. Thanks to their excellent solubility and film-forming ability, uniform films of P1/2/3 polymers can be readily fabricated on silica wafers by a simple spin-coating technique.

Figure 8:
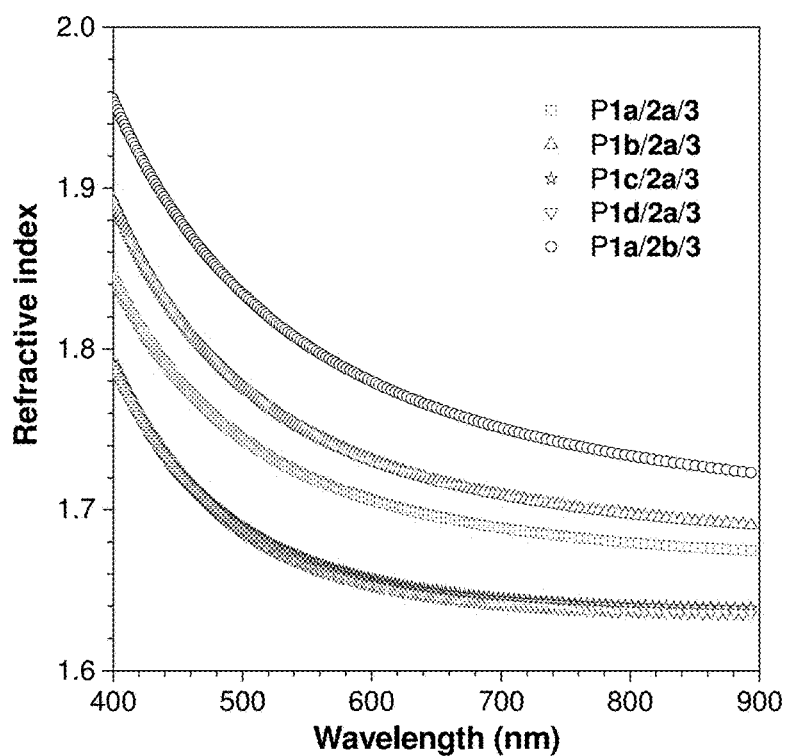
FIG. 8 shows wavelength-dependent refractive indices of thin films of P1/2/3 polymers.

Their light refractions were investigated, with the results shown in FIG. 8. The refractive index of a polymer affects polarizability, chain flexibility, chain orientation, and the presence of heteroatom. Due to the presence of the cyano group and polarized aromatic rings, all of the thin films of P1/2/3 polymers show high RI values of 1.6482-1.7682 at 632.8 nm. Notably, the fully conjugated P1a/2b/3 shows the highest RI value of 1.7682 among all the polymers, and such a high RI value is presently among the best available for pure organic polymer materials.

In addition to refraction, optical dispersion is another crucial phenomenon for optical materials, especially in photographic and microscopic lenses, where dispersion causes chromatic aberration to lowering the resolution of imaging. The Abbé number ($v_D$) of a material serves as a measure of the variation or dispersion in its RI value with wavelength and is defined as $(n_D-1)/(n_F-n_C)$, where $n_D$, $n_F$ and $n_C$ are the RI values at wavelengths of Fraunhofer D, F, and C spectral lines of 589.2, 486.1 and 656.3 nm, respectively. The corresponding D values are calculated as the reciprocal of $v_D$. Consequently, polymer films with small D values are desired for industrial applications. Table 6 shows the $v_D$ and D values of P1/2/3 polymers, which fall within the scope of 9.2636-13.4443 and 0.0744-0.1079, respectively. In combination with their high RI value, these optical data demonstrate the high performance of P1/2/3 polymers as advanced optical materials for industrial applications.

TABLE 6

Refractive indices and dispersion of films of P1/2/3[a]

| polymer | $n_{632.8}$ | $v_D$ | D |
|---|---|---|---|
| P1a/2a/3 | 1.6987 | 12.1016 | 0.0826 |
| P1b/2a/3 | 1.7217 | 10.3663 | 0.0965 |
| P1c/2a/3 | 1.6515 | 13.4443 | 0.0744 |
| P1d/2a/3 | 1.6482 | 13.3362 | 0.0750 |
| P1a/2b/3 | 1.7682 | 9.2636 | 0.1079 |

[a]Abbreviation: n = refractive index, $v_D$ = Abbé number = $(n_D - 1)/(n_F - n_C)$, where $n_D$, $n_F$ and $n_C$ are the RI values at wavelengths of Fraunhofer D, F and C spectral lines of 589.2, 486.1 and 656.3 nm, respectively, $D = 1/v_D$.

Photopatterning

As discussed previously, the P1/2/3 polymers are all AIE polymers with excellent solubility, which can be readily fabricated into emissive thin film by spin-coating of their solutions. Further, such characteristics make P1/2/3 polymers promising candidates in the field of photolithography. Here, P1a/2a/3 and P1a/2b/3 are taken for demonstration.

Figure 9:
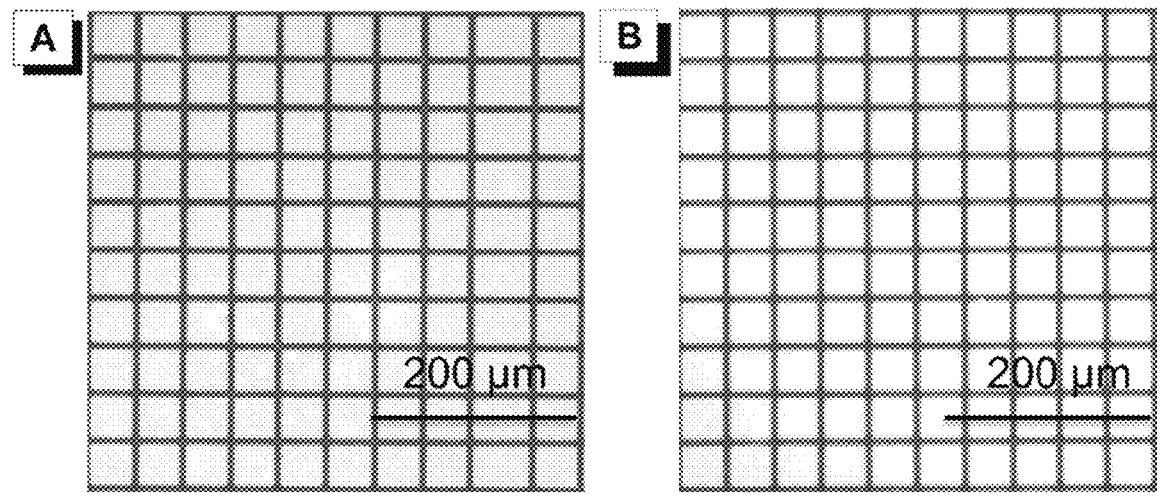
FIG. 9 shows photopatterns generated by photolithography of a film of (A) P1a/2a/3 and (B) P1a/2b/3 through a copper mask taken under UV irradiation. Excitation wavelength: 330-385 nm.
Figure 10:
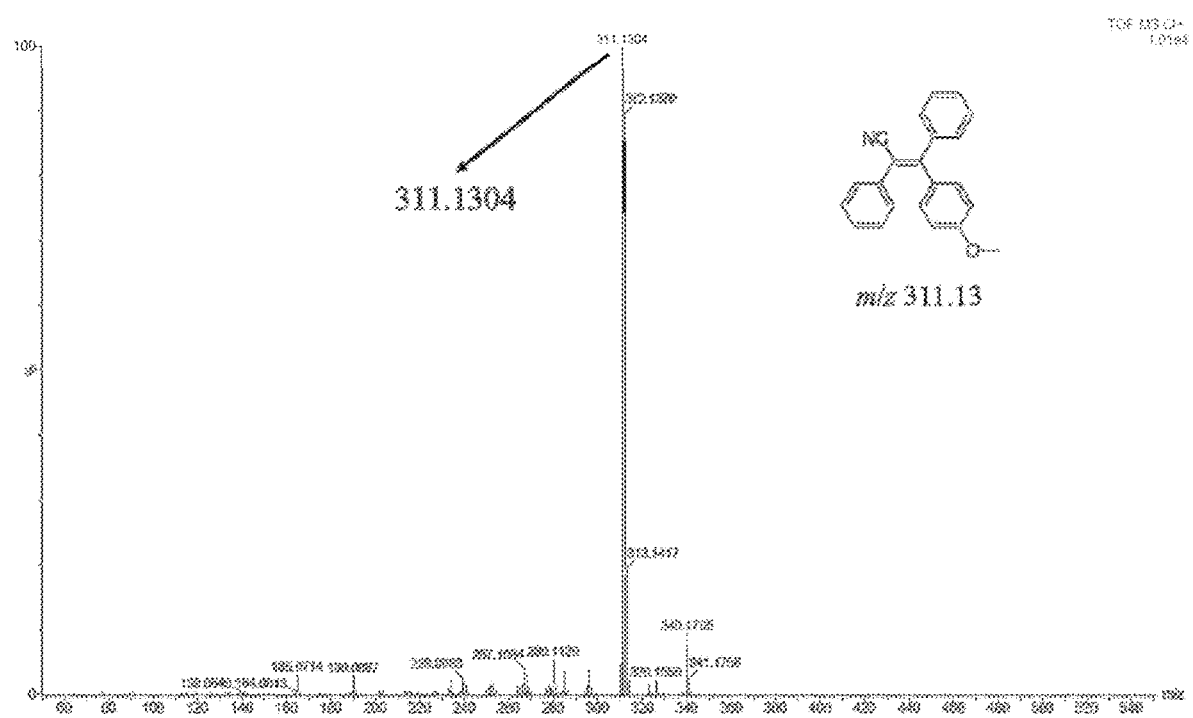
FIG. 10 shows high-resolution mass spectrum of model compound 6.
Figure 11:
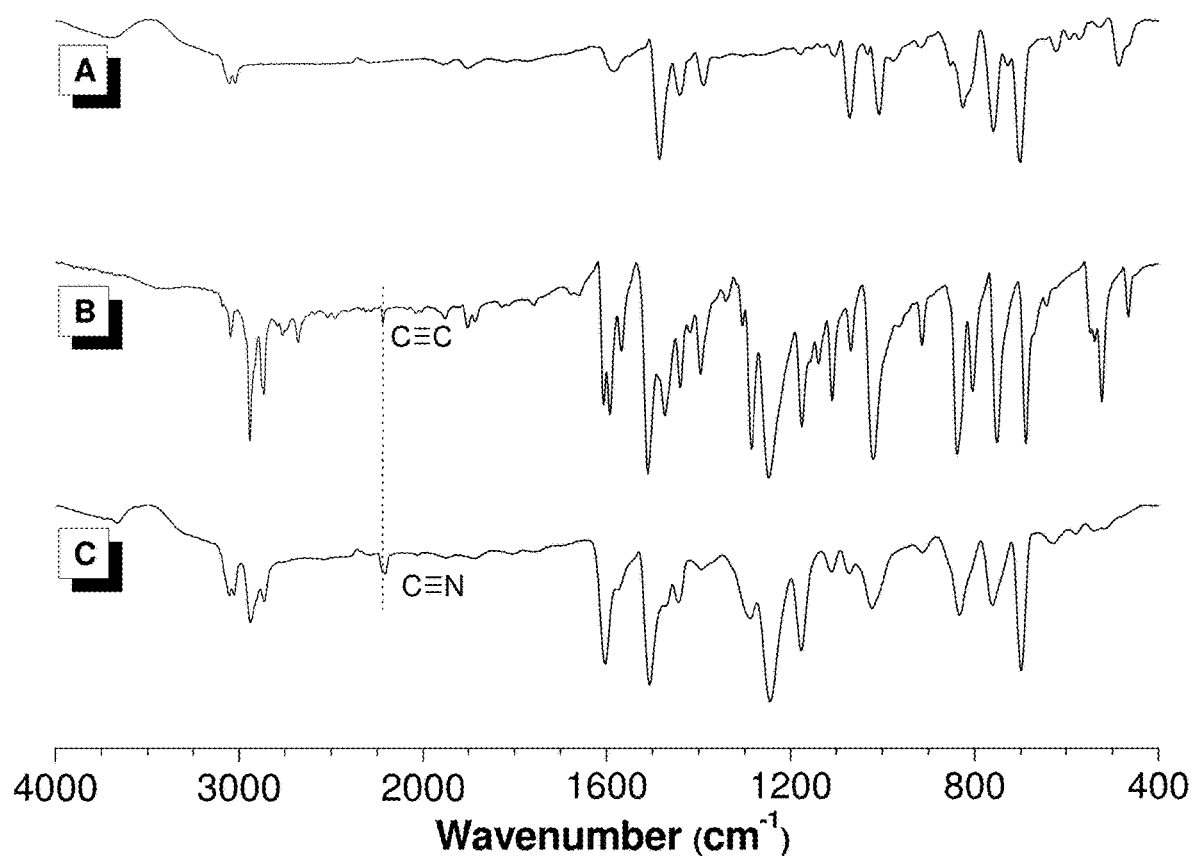
FIG. 11 shows IR spectra of (A) 1b, (B) 2a, and (C) P1b/2a/3.
Figure 12:
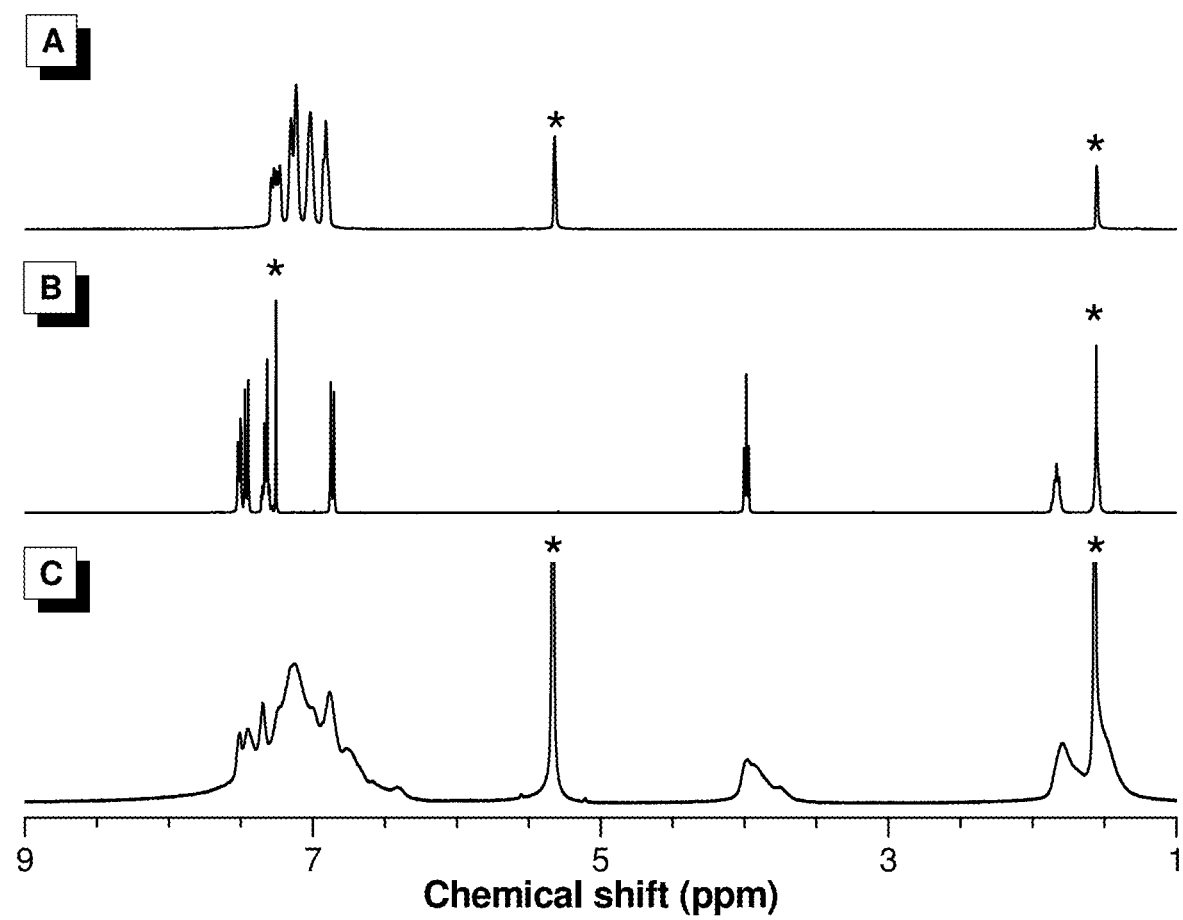
FIG. 12 shows $^1$H NMR spectra of (A) 1b, (B) 2a, and (C) P1b/2a/3 in CDCl$_3$ or CD$_2$Cl$_2$. The solvent peaks were marked with asterisks.
Figure 13:
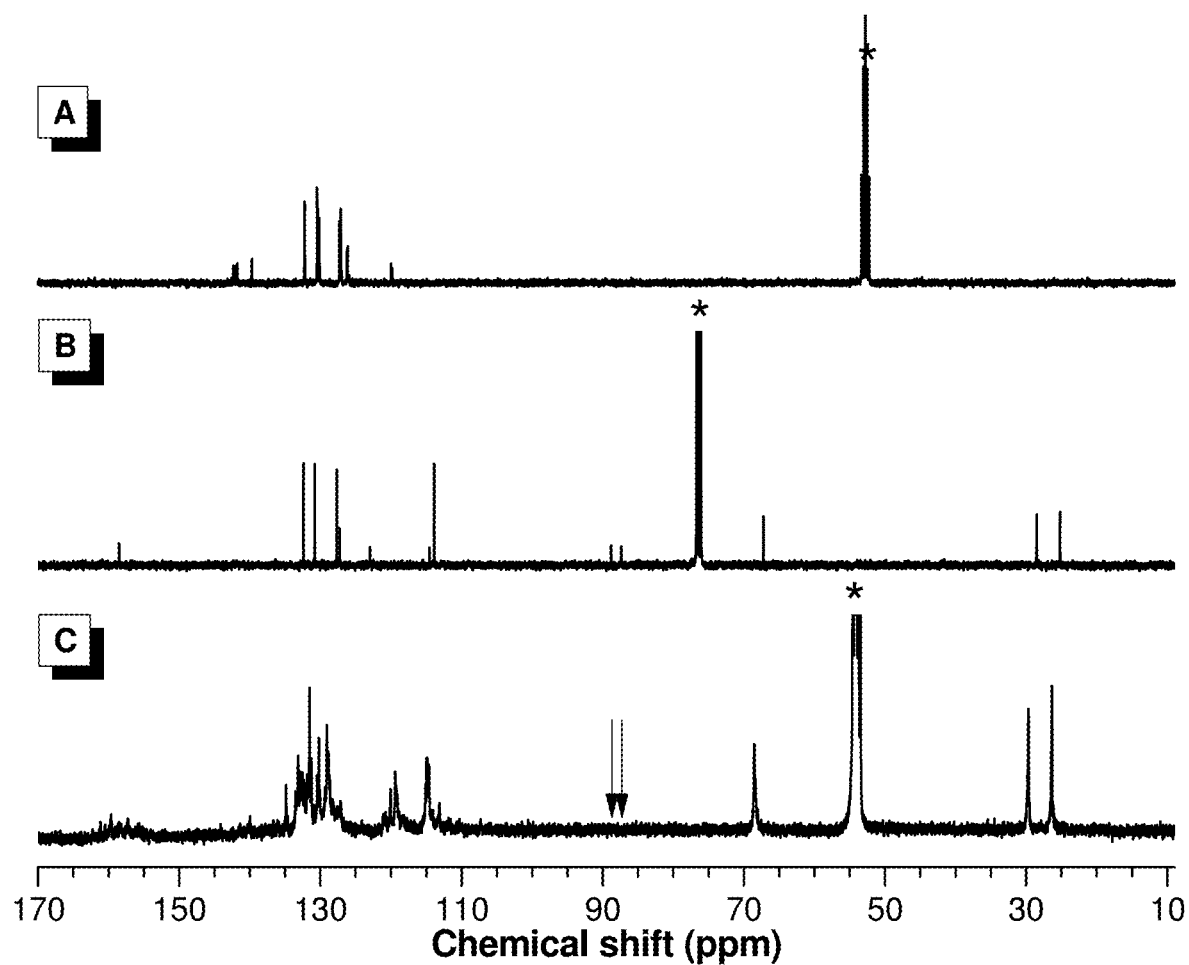
FIG. 13 shows $^{13}$C NMR spectra of (A) 1b, (B) 2a, and (C) P1b/2a/3 in CDCl$_3$ or CD$_2$Cl$_2$. The solvent peaks were marked with asterisks.
Figure 14:
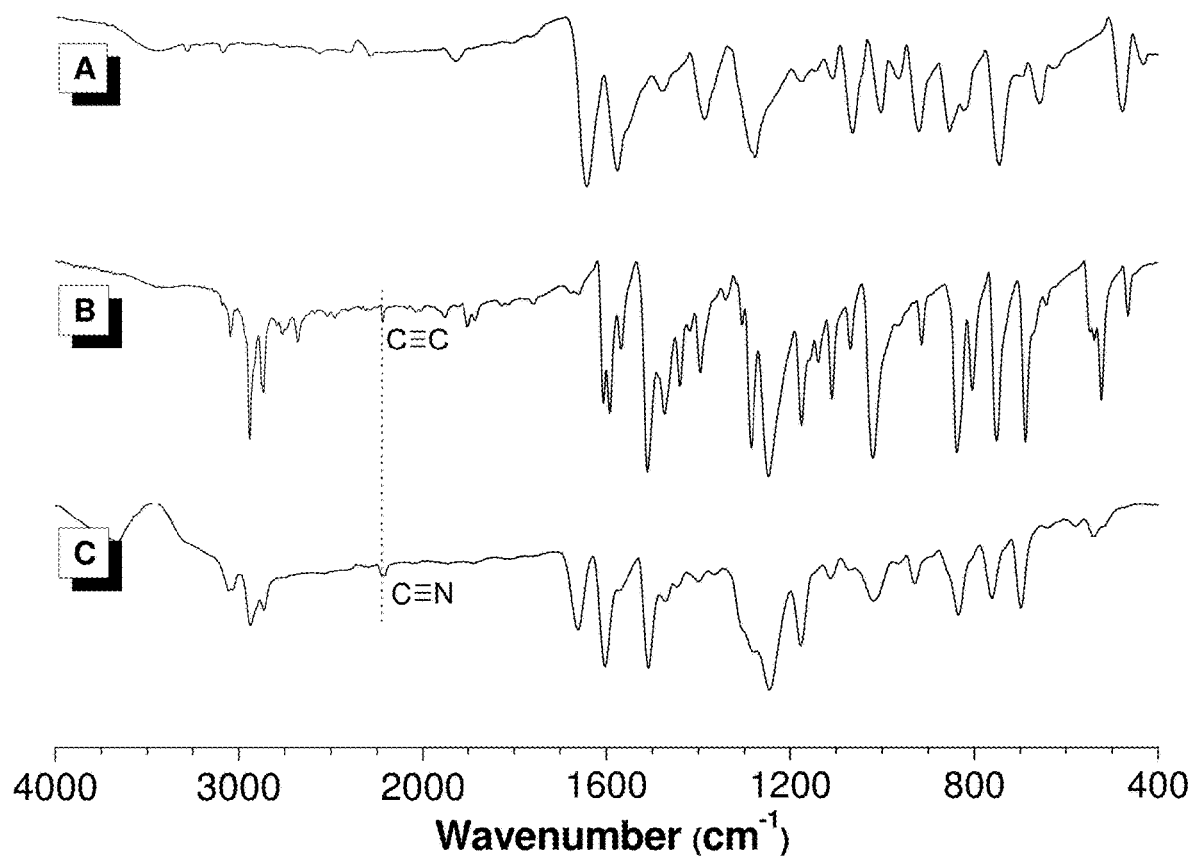
FIG. 14 shows IR spectra of (A) 1c, (B) 2a, and (C) P1c/2a/3.
Figure 15:
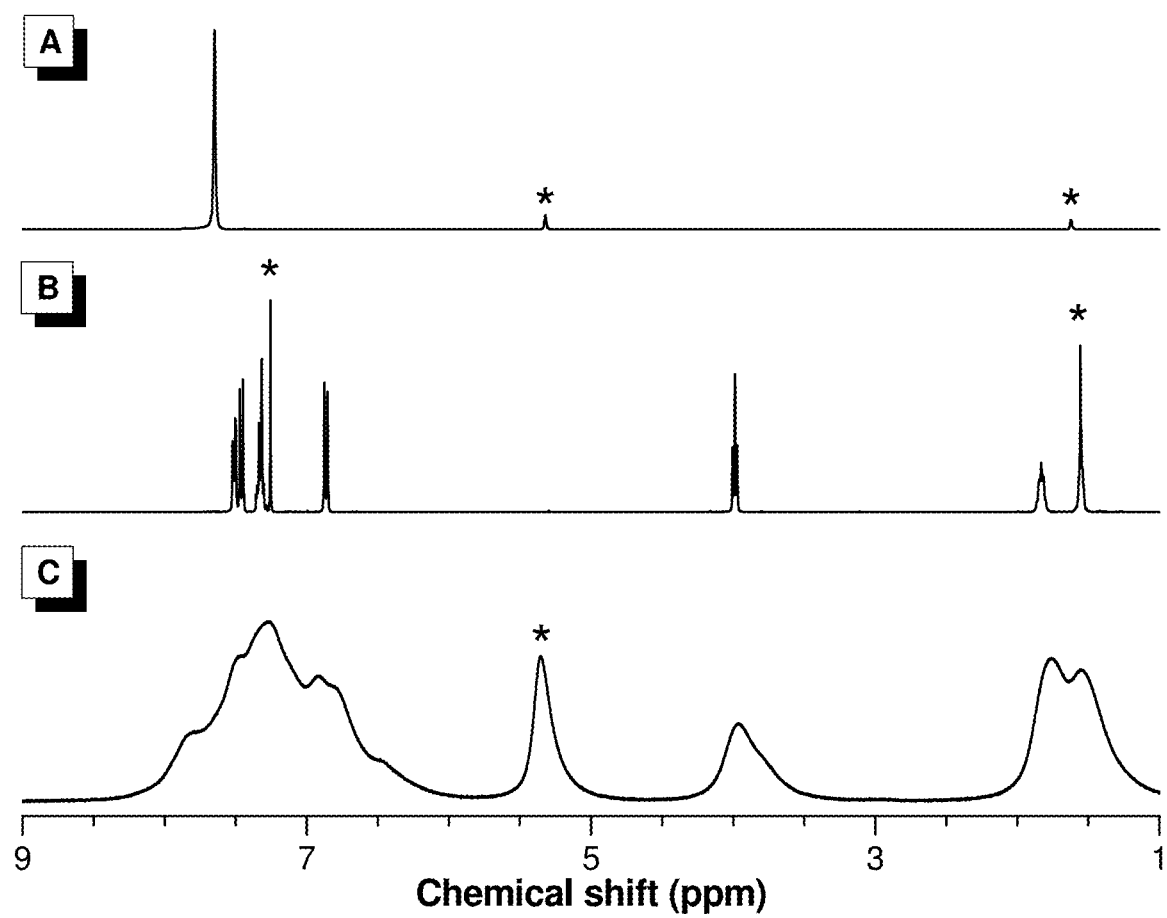
FIG. 15 shows $^1$H NMR spectra of (A) 1c, (B) 2a, and (C) P1c/2a/3 in CDCl$_3$ or CDCl$_2$. The solvent peaks were marked with asterisks.
Figure 16:
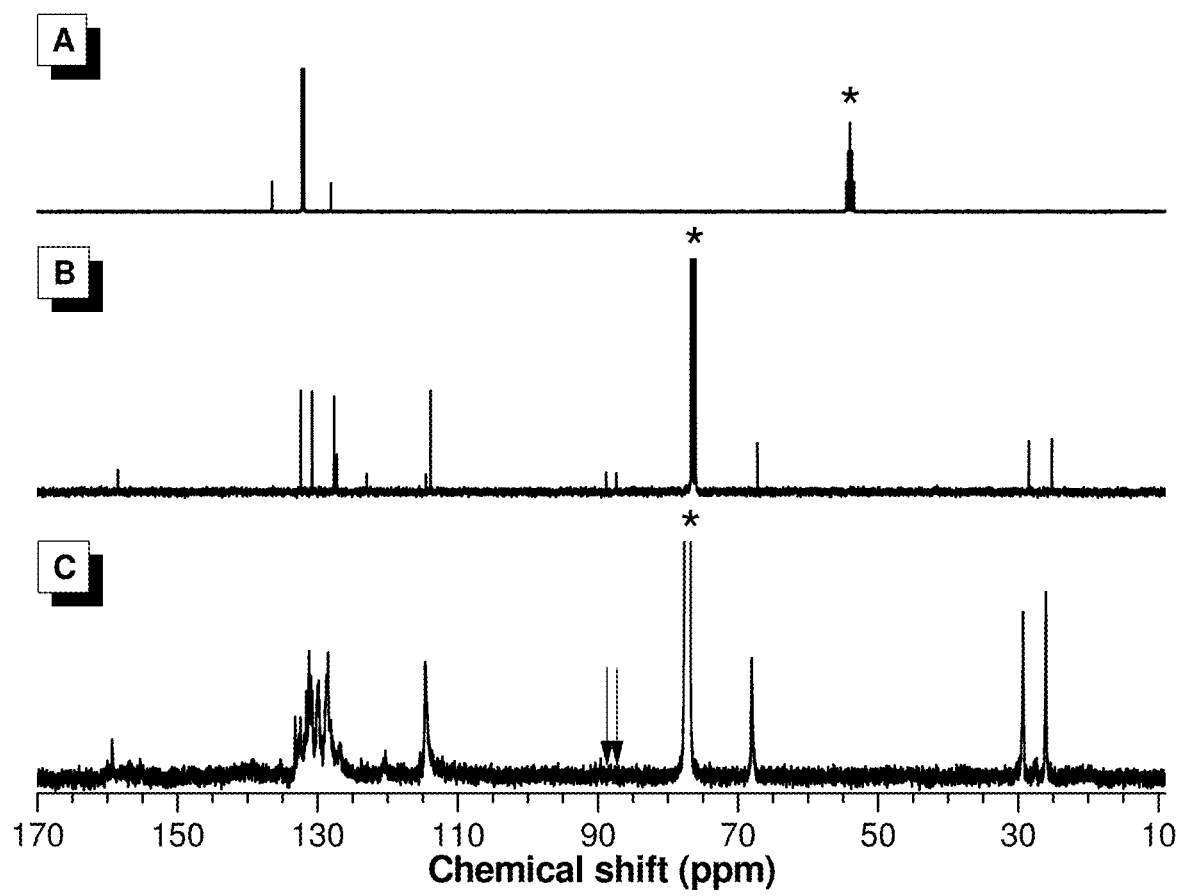
FIG. 16 shows $^{13}$C NMR spectra of (A) 1c, (B) 2a, and (C) P1c/2a/3 in CDCl$_3$ or CDCl$_2$. The solvent peaks were marked with asterisks.
Figure 17:
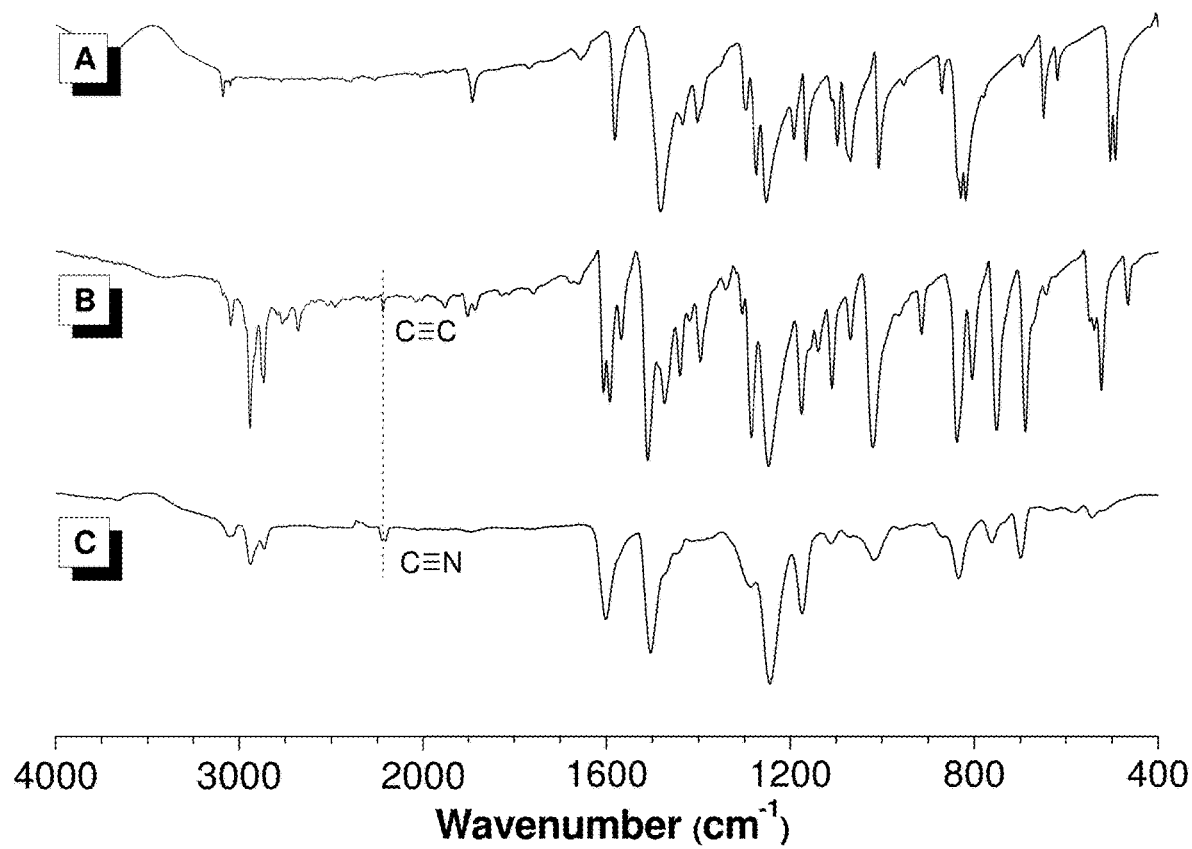
FIG. 17 shows IR spectra of (A) 1d, (B) 2a, and (C) P1d/2a/3.
Figure 18:
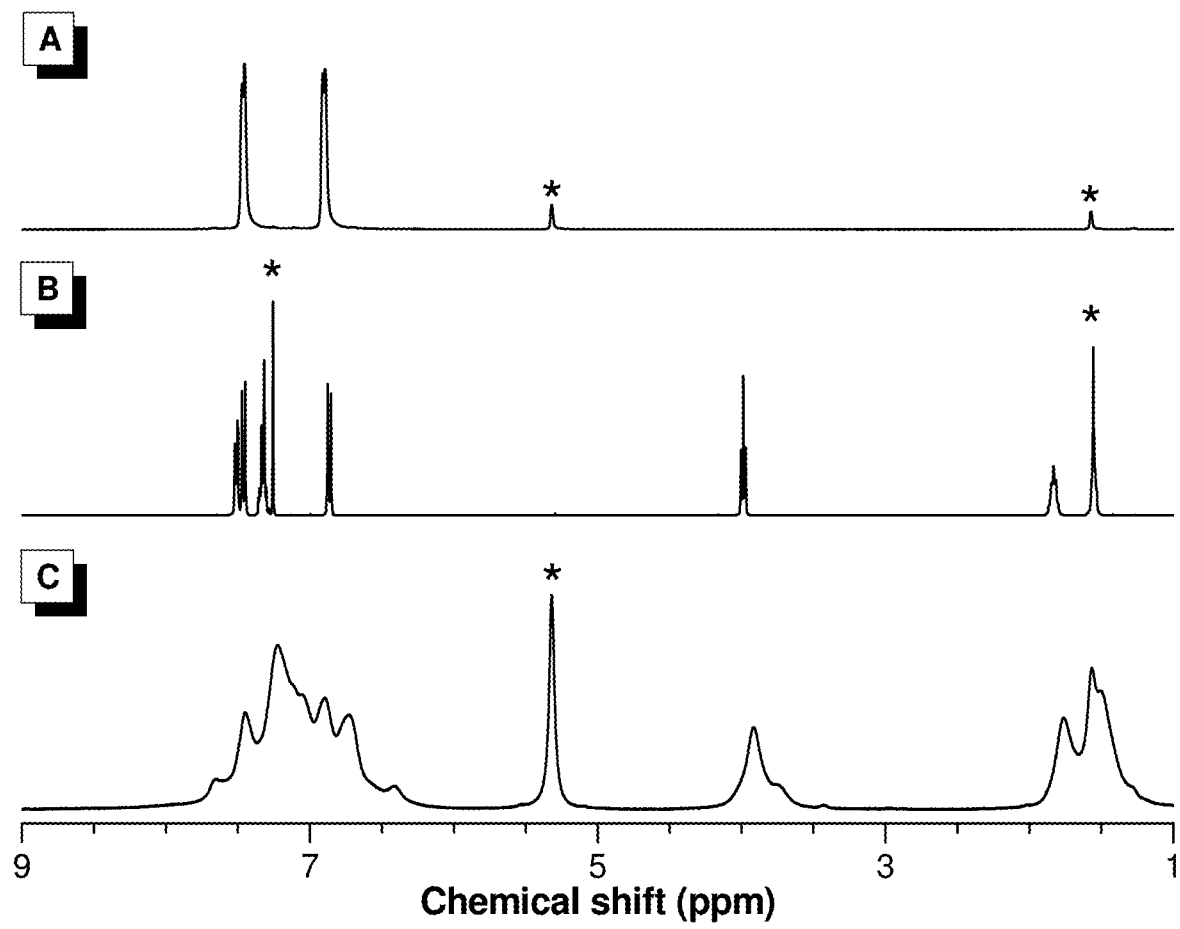
FIG. 18 shows $^1$H NMR spectra of (A) 1d, (B) 2a, and (C) P1d/2a/3 in CDCl$_3$ or CDCl$_2$. The solvent peaks were marked with asterisks.
Figure 19:
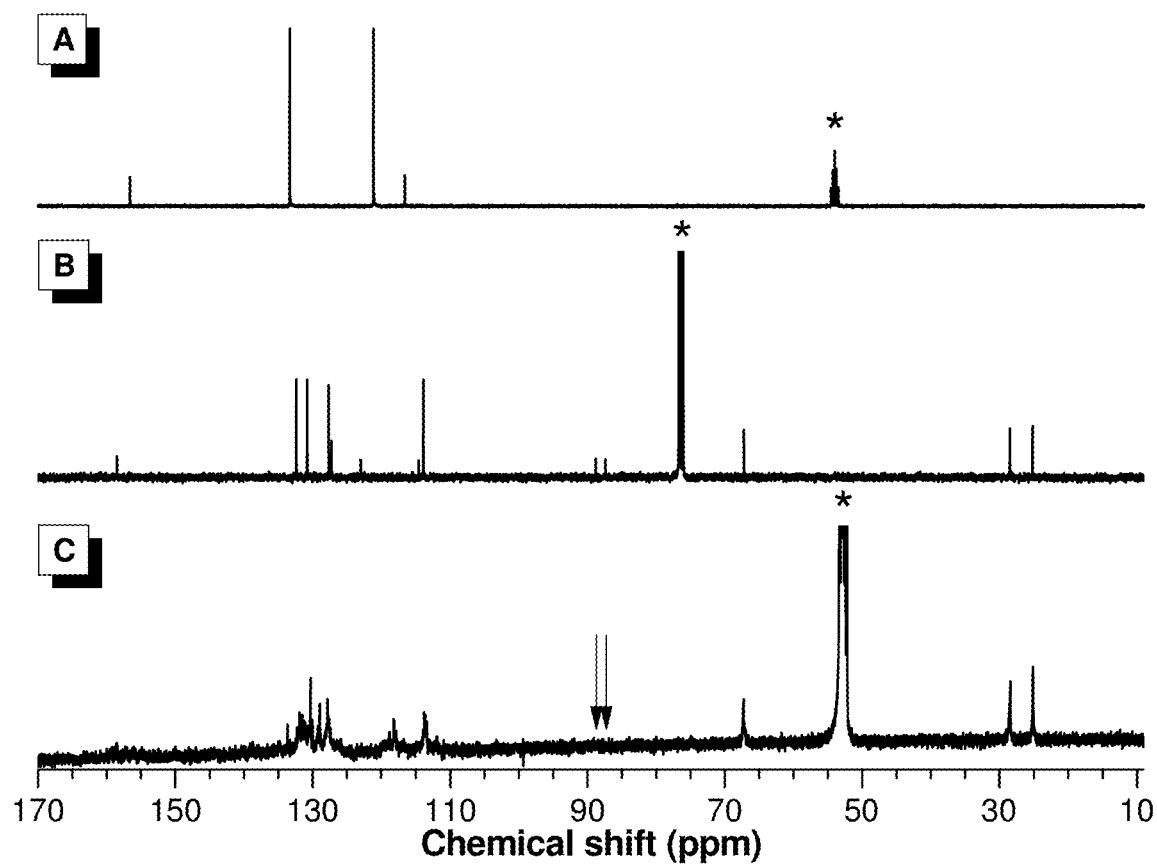
FIG. 19 shows $^{13}$C NMR spectra of (A) 1d, (B) 2a, and (C) P1d/2a/3 in CDCl$_3$ or CD$_2$Cl$_2$. The solvent peaks were marked with asterisks.
Figure 20:
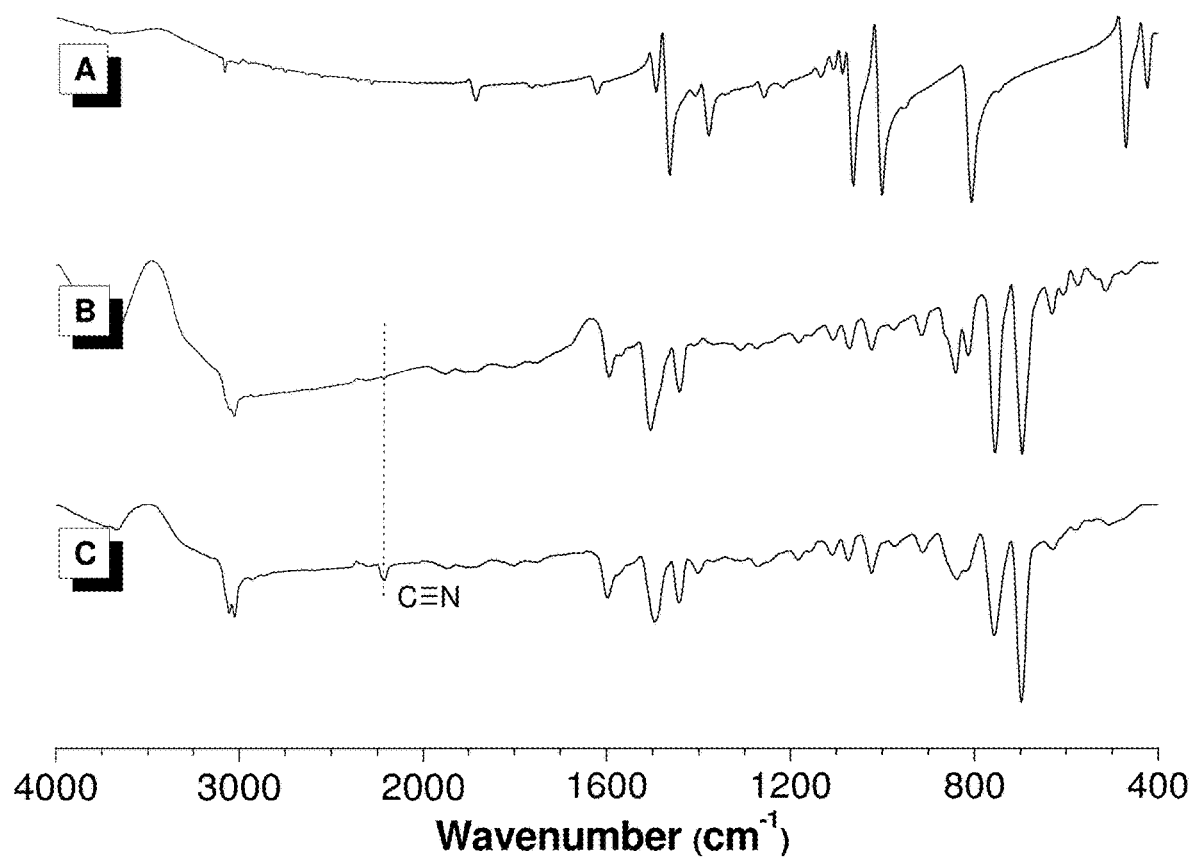
FIG. 20 shows IR spectra of (A) 1a, (B) 2b, and (C) P1a/2b/3.
Figure 21:
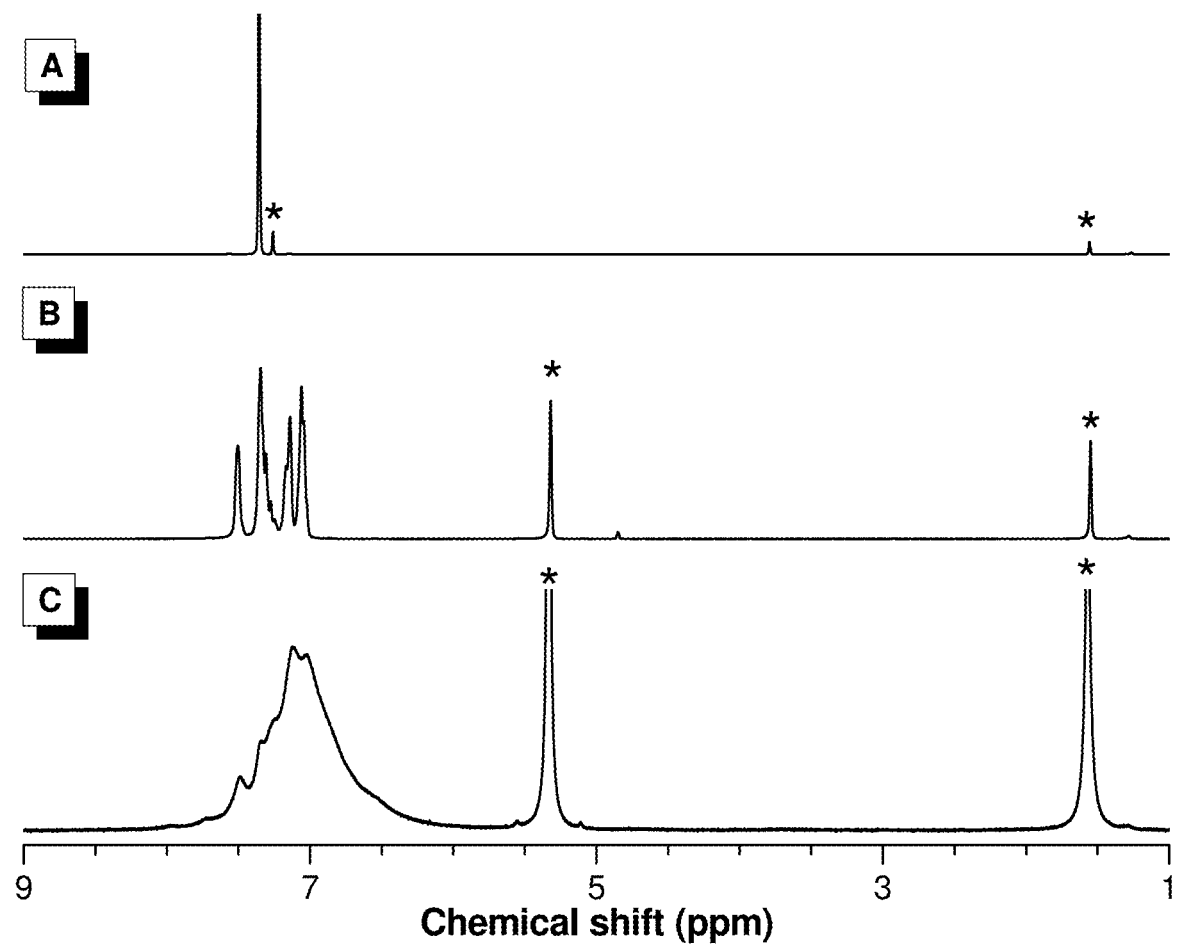
FIG. 21 shows $^1$H NMR spectra of (A) 1a, (B) 2b, and (C) P1a/2b/3 in CDCl$_3$ or CD$_2$Cl$_2$. The solvent peaks were marked with asterisks.
Figure 22:
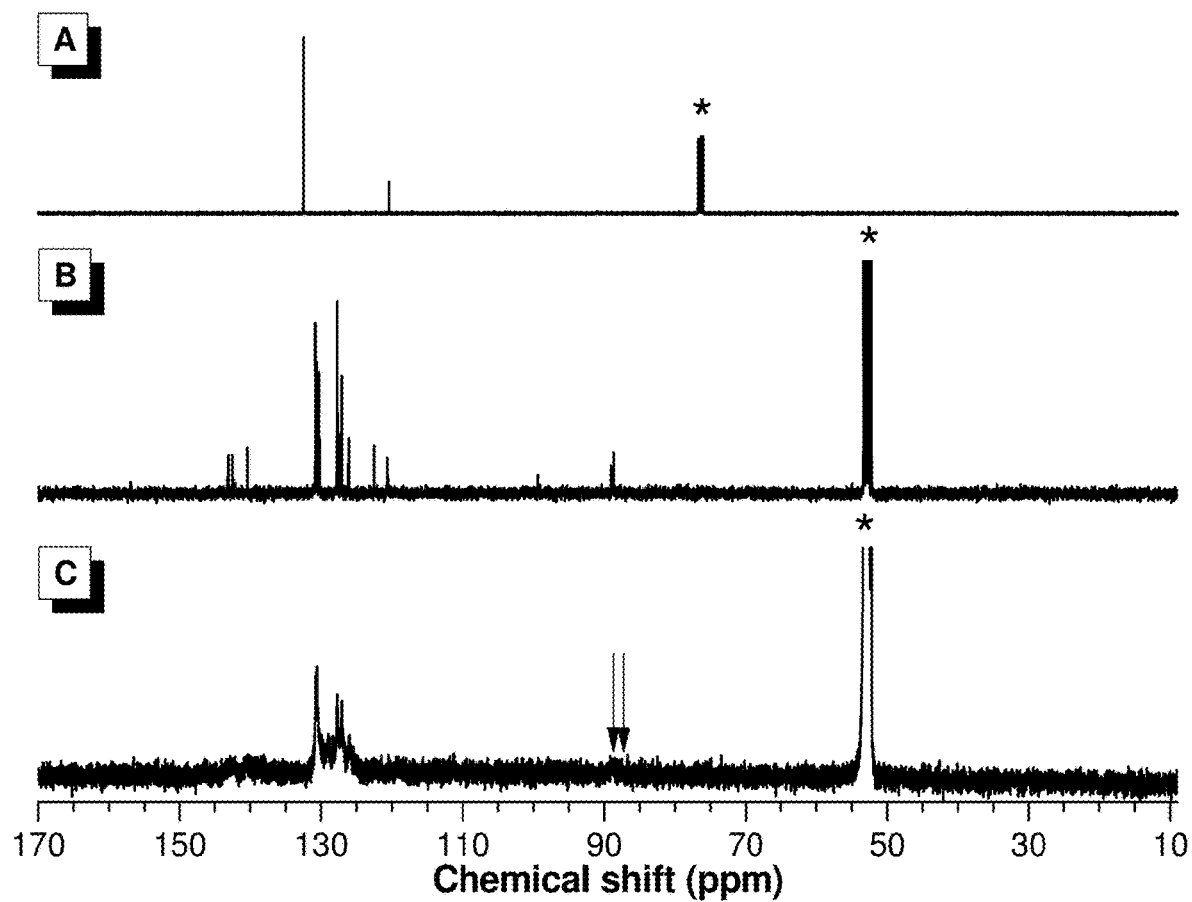
FIG. 22 shows $^{13}$C NMR spectra of (A) 1a, (B) 2b, and (C) P1a/2b/3 in CDCl$_3$ or CD$_2$Cl$_2$. The solvent peaks were marked with asterisks.

By spin-coating of its corresponding dichloroethane solution, a uniform thin film of P1a/2a/3 was obtained on a silicon water. The formed polymer film was then irradiated with UV excitation in air through a copper photomask. The exposed parts (lines) undergo photo-oxidation in the presence of UV irradiation, which quenched their light emission. However, the unexposed areas (squares) remain intact and emit light when irradiated. As such, a well-resolved two-dimensional fluorescent pattern with green emission color was generated without the need of the development process (FIG. 9A).

Figure 29:
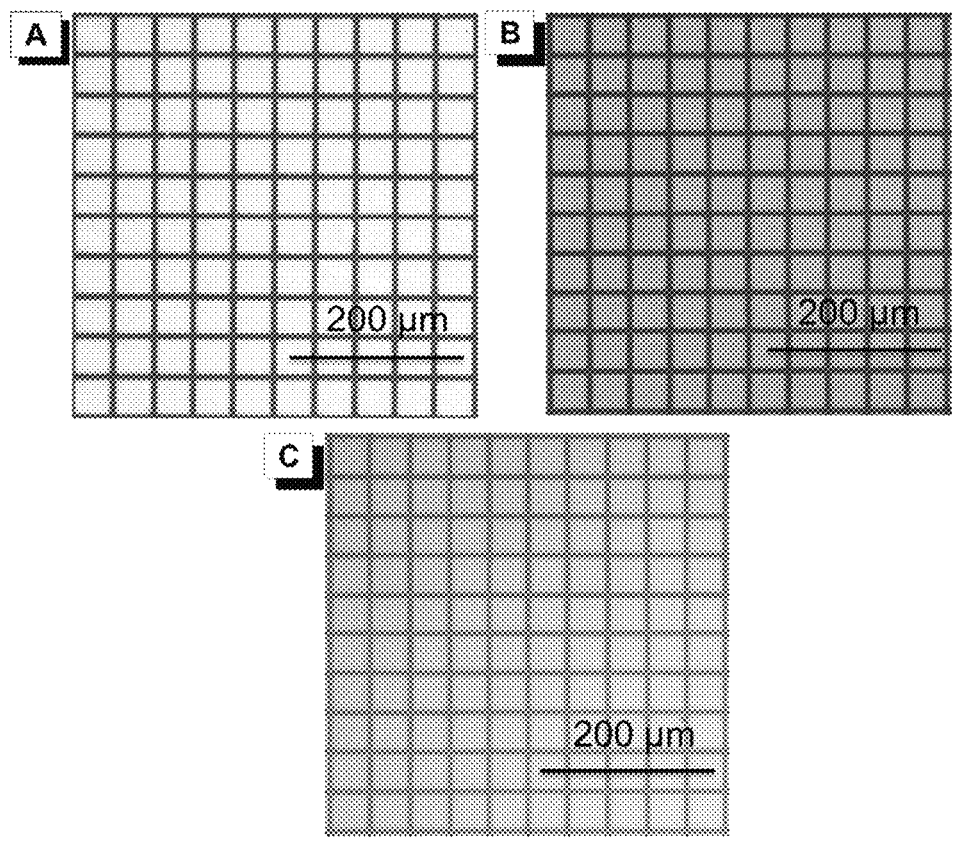
FIG. 29 shows two-dimensional fluorescent photopatterns generated by photo-oxidation of (A) P1b/2a/3, (B) P1c/2a/3, and (C) P1d/2a/3. The photographs were taken under 330-385 nm UV illuminations.
Figure 30:
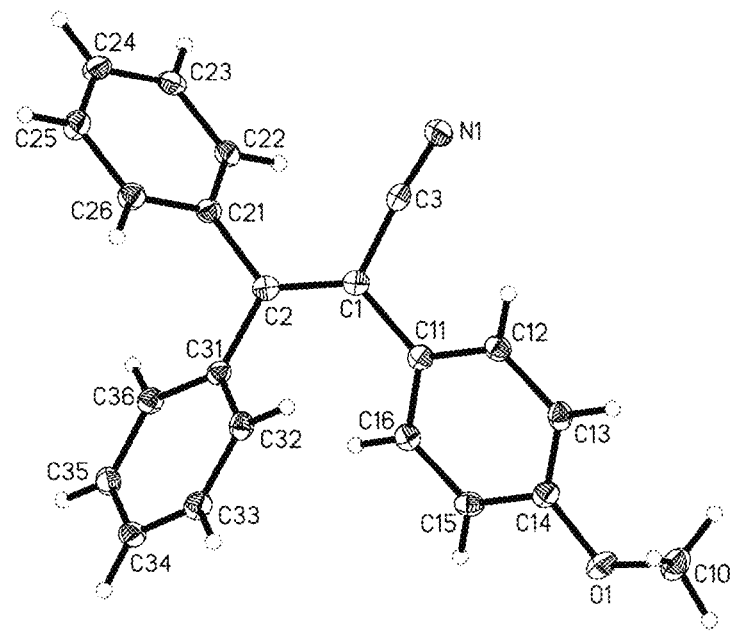

Such photosensitivity is caused by the fact that the double bonds in the polymers may undergo photo-decomposition and subsequent photo-chemical reaction with oxygen upon UV irradiation. This breaks the electronic conjugation, bringing emission quenching as a consequence. Fluorescent patterns with different emission color, such as yellow (FIG. 9B), can be generated from P1a/2b/3. Similar fluorescent patterns can also be generated from other PTPANs (FIG. 29). These distinguish luminescent patterns prove that P1/2/3 polymers can be used for manufacturing high resolution organic semiconductor and photonic devices in a cost-efficient fashion.

With the information contained herein, various departures and modifications from precise descriptions of the present subject matter will be readily apparent to those skilled in the art to which the present subject matter pertains, without departing from the spirit and the scope of the below claims. The present subject matter is not considered limited in scope to the procedures, properties, or components defined, since the preferred embodiments and other descriptions are intended only to be illustrative of particular aspects of the presently provided subject matter.

The invention claimed is:

1. A polymer, wherein the polymer is poly(triphenylacrylonitrite)s (PTPANs) and comprises a backbone structure of

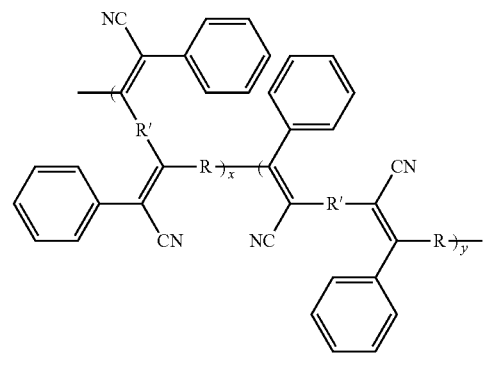

P1a-d/2a-b/3 wherein x and y are integers;

wherein each R is independently selected from the group consisting of

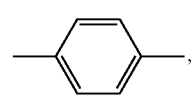

1a

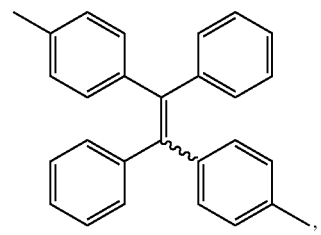

1b

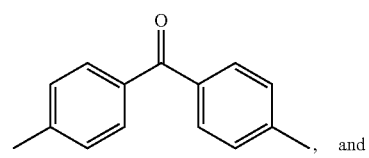

, and

1c

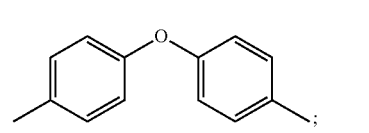

;

1d and wherein each R' is independently selected from the group consisting of

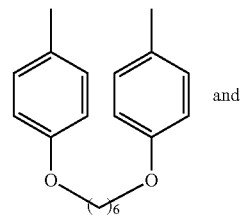

and

2a

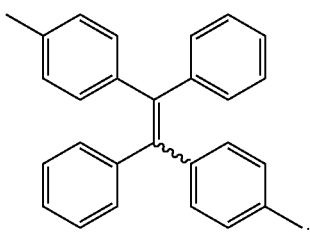

2b

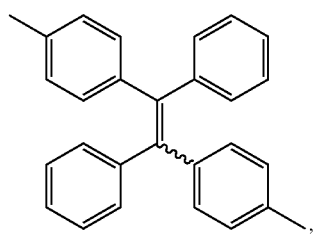

1b

2. The polymer of claim 1, wherein the polymer is selected from the group consisting of P1a/2a/3, P1b/2a/3, P1c/2a/3, P1d/2a/3, and P1a/2b/3.

3. The polymer of claim 1, wherein the polymer of claim 1 exhibits aggregation induced emission characteristics.

4. The polymer of claim 1, wherein the polymer has a high molecular weight.

5. The polymer of claim 1, wherein the polymer has a tunable emission color.

6. The polymer of claim 1, wherein the polymer has a high thermal stability with a degradation temperature of above 410° C.

7. The polymer of claim 1, wherein the polymer has a refractive index of 1.6482-1.7682 at a wavelength of 632.8 nm.

8. The polymer of claim 1, wherein the polymer is photosensitive.

9. The polymer of claim 8, wherein the polymer may be used for fluorescent photopatterning.

10. The polymer of claim 1, wherein the polymer may be used as a thin film.

11. A method of synthesis of poly(triphenylacrylonitrite)s (PTPANs) comprising:
    polycoupling dibromoarenes, internal diynes, and potassium ferrocyanide, resulting in polycoupled dibromoarenes, internal diynes, and potassium ferrocyanide; and
    producing poly(triphenylacrylonitrite)s (PTPANs) by catalysis of the polycoupled dibromoarenes, internal diynes, and potassium ferrocyanide with palladium acetate and sodium bicarbonate, wherein the catalysis is allowed to proceed in dimethylacetamide under nitrogen at a prescribed temperature for a prescribed time.

12. The method of claim 11, wherein the prescribed temperature is 120° C.

13. The method of claim 11, wherein the prescribed time is 6-24 hours.

14. The method of claim 13, wherein the prescribed time is 6 hours.

15. The method of synthesis of claim 11, wherein the dibromoarenes have a structure of

wherein R is selected from the group consisting of

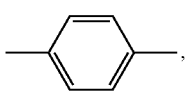

1a

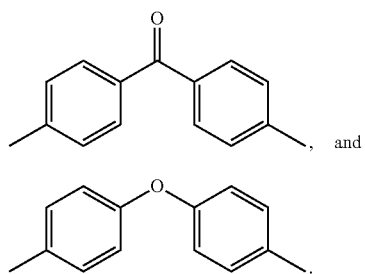

1c

, and

1d

16. The method of synthesis of claim 11, wherein the internal diynes have a structure of

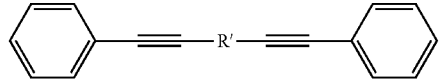

wherein R' is selected from the group consisting of

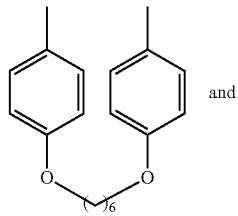

2a and

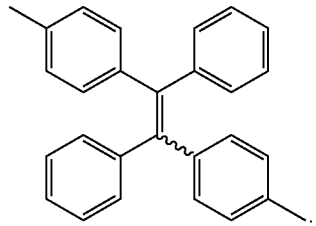

2b

17. The method of claim 11, wherein the synthesis is a step polymerization with fast monomer consumption and slow polymer growth.

18. The method of claim 11, wherein the synthesis has a high reaction rate.

19. The method of claim 11, wherein the synthesis has a yield of 60-84%.

20. The method of claim 11, wherein the PTPANs synthesized have high molecular weights of up to 223,000.

* * * * *